(12) United States Patent
Bard et al.

(10) Patent No.: US 11,765,800 B2
(45) Date of Patent: *Sep. 19, 2023

(54) USER INTERFACE FOR A CONTROL DEVICE

(71) Applicant: Lutron Technology Company LLC, Coopersburg, PA (US)

(72) Inventors: Benjamin F. Bard, Nazareth, PA (US); Chris Dimberg, Easton, PA (US); Matthew V. Harte, Stewartsville, NJ (US); Jason C. Killo, Emmaus, PA (US); Matthew Philip McDonald, Phoenixville, PA (US); Daniel L. Twaddell, Bethlehem, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/553,890

(22) Filed: Dec. 17, 2021

(65) Prior Publication Data

US 2022/0110197 A1    Apr. 7, 2022

Related U.S. Application Data

(63) Continuation of application No. 16/683,645, filed on Nov. 14, 2019, now Pat. No. 11,234,300, which is a
(Continued)

(51) Int. Cl.
*H05B 45/20*  (2020.01)
*H05B 47/19*  (2020.01)
(Continued)

(52) U.S. Cl.
CPC ............. *H05B 45/20* (2020.01); *G05B 15/02* (2013.01); *G05G 1/105* (2013.01); *H01H 19/14* (2013.01);
(Continued)

(58) Field of Classification Search
CPC ...... H05B 45/20; H05B 47/175; G05B 15/02; G05G 1/105; H01H 19/14; H01H 23/14; H02J 3/00; H03K 17/962
See application file for complete search history.

(56) References Cited

U.S. PATENT DOCUMENTS

| | | | |
|---|---|---|---|
| 7,242,150 | B2 | 7/2007 | Dejonge et al. |
| 7,546,473 | B2 | 6/2009 | Newman et al. |

(Continued)

FOREIGN PATENT DOCUMENTS

| | | |
|---|---|---|
| CN | 2596671 Y | 12/2003 |
| WO | 2007072316 A2 | 6/2007 |
| WO | 2013067550 A2 | 5/2013 |

*Primary Examiner* — Jared Fureman
*Assistant Examiner* — Duc M Pham
(74) *Attorney, Agent, or Firm* — Flaster Greenberg, P.C.

(57) ABSTRACT

A battery-powered control device may be configured to control an amount of power delivered to one or more electrical loads and provide various feedback associated with the control device and/or the electrical loads. The feedback may indicate a low battery condition and/or the amount of power delivered to the one or more electrical loads. The control device may include a light bar and/or one or more indicator lights for providing the feedback. The control device may operate in different modes including a normal mode and a low battery mode.

20 Claims, 19 Drawing Sheets

Related U.S. Application Data continuation of application No. 15/613,105, filed on Jun. 2, 2017, now Pat. No. 10,524,333.

(60) Provisional application No. 62/356,288, filed on Jun. 29, 2016, provisional application No. 62/345,449, filed on Jun. 3, 2016.

(51) Int. Cl.

| | |
|---|---|
| *H05B 45/24* | (2020.01) |
| *H05B 47/175* | (2020.01) |
| *G05B 15/02* | (2006.01) |
| *H01H 19/14* | (2006.01) |
| *H01H 23/14* | (2006.01) |
| *H02J 3/00* | (2006.01) |
| *G05G 1/10* | (2006.01) |
| *H01H 19/54* | (2006.01) |
| *H03K 17/96* | (2006.01) |
| *H01H 19/02* | (2006.01) |
| *G05G 1/08* | (2006.01) |

(52) U.S. Cl.
CPC ............ *H01H 19/54* (2013.01); *H01H 23/14* (2013.01); *H02J 3/00* (2013.01); *H03K 17/962* (2013.01); *H05B 45/24* (2020.01); *H05B 47/175* (2020.01); *H05B 47/19* (2020.01); *G05B 2219/2614* (2013.01); *G05G 1/08* (2013.01); *H01H 19/025* (2013.01); *H01H 2300/03* (2013.01); *Y02B 90/20* (2013.01); *Y04S 20/14* (2013.01)

(56) References Cited

U.S. PATENT DOCUMENTS

| | | |
|---|---|---|
| 7,573,208 B2 | 8/2009 | Newman et al. |
| 7,834,856 B2 | 11/2010 | Grinshpoon et al. |
| 7,940,167 B2 | 5/2011 | Steiner et al. |
| 8,009,042 B2 | 8/2011 | Steiner et al. |
| 8,199,010 B2 | 6/2012 | Sloan et al. |
| 8,330,638 B2 | 12/2012 | Altonen et al. |
| 8,410,706 B2 | 4/2013 | Steiner et al. |
| 8,451,116 B2 | 5/2013 | Steiner et al. |
| 8,664,881 B2 | 3/2014 | Salvestrini et al. |
| 8,950,461 B2 | 2/2015 | Ogden et al. |
| 9,112,466 B1 | 8/2015 | Koh |
| 9,208,965 B2 | 12/2015 | Busby et al. |
| 9,418,802 B2 | 8/2016 | Romano et al. |
| 9,520,247 B1 | 12/2016 | Finnegan et al. |
| 9,799,469 B2 | 10/2017 | Bailey et al. |
| 9,959,997 B2 | 5/2018 | Bailey et al. |
| 10,524,333 B2 | 12/2019 | Bard et al. |
| 11,234,300 B2 * | 1/2022 | Bard ..................... H05B 47/19 |
| 2008/0111491 A1 | 5/2008 | Spira et al. |
| 2009/0206769 A1 | 8/2009 | Biery et al. |
| 2013/0342131 A1 | 12/2013 | Recker et al. |
| 2014/0117871 A1 | 5/2014 | Swatsky et al. |
| 2015/0077021 A1 | 3/2015 | McCarthy et al. |
| 2015/0371534 A1 | 12/2015 | Dimberg et al. |
| 2016/0073479 A1 | 3/2016 | Erchak et al. |
| 2017/0105176 A1 | 4/2017 | Finnegan et al. |
| 2017/0278383 A1 | 9/2017 | Dimberg et al. |
| 2018/0070431 A1 | 3/2018 | Charlton et al. |
| 2018/0190451 A1 | 7/2018 | Scruggs |
| 2019/0006129 A1 | 1/2019 | Dimberg et al. |

\* cited by examiner

USER INTERFACE FOR A CONTROL DEVICE

CROSS-REFERENCE TO RELATED APPLICATIONS

This application is a continuation of U.S. Non-Provisional patent application Ser. No. 16/683,645, filed Nov. 14, 2019, which is a continuation of U.S. Non-Provisional patent application Ser. No. 15/613,105, filed Jun. 2, 2017, which issued as U.S. Pat. No. 10,524,333 on Dec. 31, 2019, which claims the benefit of Provisional U.S. Patent Application No. 62/345,449, filed Jun. 3, 2016, and Provisional U.S. Patent Application No. 62/356,288, filed Jun. 29, 2016, the disclosures of which are incorporated herein by reference in their entireties.

BACKGROUND

A load control system may include one or more electrical loads that a user can control via a load control device. These electrical loads may include, for example, lighting loads, HVAC units, motorized window treatment or projection screens, humidity control units, audio systems or amplifiers, Internet of Things (IoT) devices, and/or the like. The electrical loads may have advanced features that may be controlled via the load control device. For example, the load control device may be used to control a lighting load to emit light of varying intensities and/or colors. A traditional load control device generally has a very simplistic user interface. For instance, there is usually no feedback mechanism for informing a user of the load control device about the type and/or amount of control being applied, and/or the operational status (e.g., battery status) of the load control device. A battery-powered load control device also frequently encounters difficulties in extending the life of the battery.

Accordingly, having a more sophisticated load control device will improve a user's experience in an advanced load control system. For example, a load control device equipped with a user interface with feedback capabilities will not only allow a user to more precisely control the electrical loads associated with the load control device, but also keep the user informed about the status of the electrical loads and/or the load control device itself. As another example, a battery-powered load control device (e.g., a remote control device) that is capable of waking up to display feedback only upon detecting a user's presence within close proximity of the load control device can prolong battery life and extend the usage time of the load control device. A load control device with one or more of the aforementioned features may also be more aesthetically appealing to a user.

SUMMARY

As described herein, a battery-powered control device may be provided for controlling an electrical load in a load control system. The control device may include a base portion, a battery compartment, a battery removal device, a low battery indicator, and a control unit. The base portion may be configured to be mounted over an actuator of a mechanical switch that controls power delivered to the electrical load. The battery compartment may be configured to store a battery for powering the control device. The battery compartment may be accessible via the battery removal device. The control unit may be configured to control an amount of power delivered to the electrical load. The control unit may be further configured to detect a low battery condition and display the low battery indicator by illuminating one or more light sources. The low battery indicator may indicate the low battery condition and the location of the battery removal device so that a user may access the battery compartment to replace the battery.

The battery-powered control device may include one or more light sources configured to be illuminated to indicate an amount of power delivered to the electrical load. The control device may operate in a normal mode and a low battery mode. During the normal mode, the control device may be configured to illuminate the one or more light sources to indicate the amount of power delivered to the electrical load. During the low battery mode, the control device may be configured to stop indicating the amount of power delivered to the electrical load via the one or more light sources, and illuminate the low battery indicator to indicate the low battery condition.

The battery-powered control device may be configured to not display the low battery indicator when the control device is in an idle mode. The control device may be capable of determining whether a user of the control device is within close proximity of the control device. The determination may be made based on a signal generated by a capacitive touch element or an electric field sensing device. Upon determining that a user of the control device is within close proximity of the control device, the control device may illuminate the low battery indicator in response to detecting a low battery condition.

DETAILED DESCRIPTION

Figure 1:
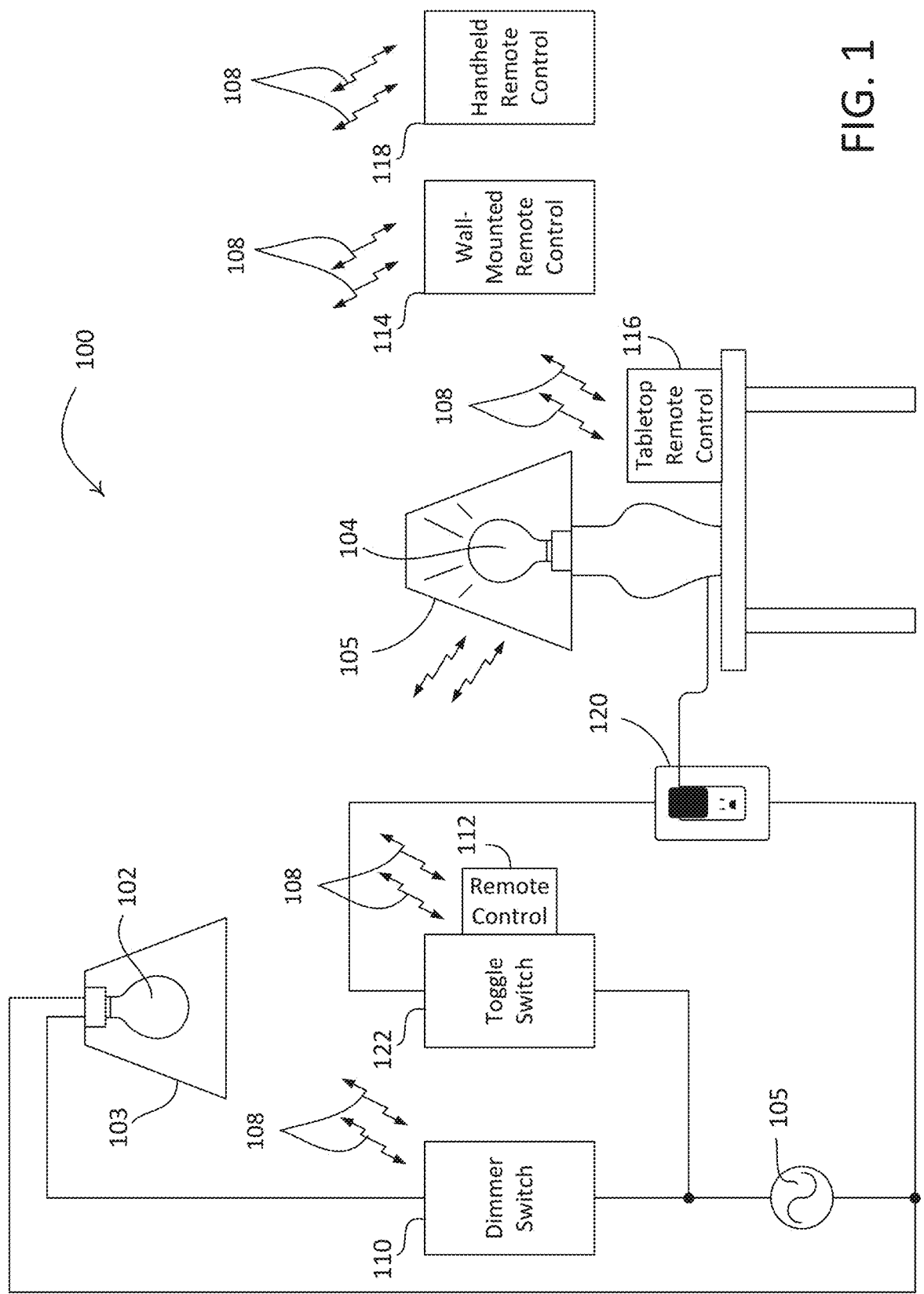
FIG. 1 depicts an example load control system that includes a plurality of example control devices.

FIG. 1 is a simplified block diagram of an example load control system. As shown, the load control system is configured as a lighting control system 100 for control of one or more lighting loads, such as a lighting load 102 that is installed in a ceiling-mounted downlight fixture 103 and a controllable lighting load 104 that is installed in a table lamp 105. The lighting loads 102, 104 shown in FIG. 1 may include light, sources of different types (e.g., incandescent lamps, fluorescent lamps, and/or LED light sources). The lighting loads may have advanced features. For example, the lighting loads may be controlled to emit light of varying intensities and/or colors in response to a user command.

The lighting control system 100 may include one or more control devices for controlling the lighting loads 102, 104 (e.g., controlling an, amount, of power delivered to the lighting loads). The lighting loads 102, 104 may be controlled substantially in unison, or be controlled individually. For example, the lighting loads may be zoned so that the lighting load 102 may be controlled by a first control device, while the lighting load 104 may be controlled by a second control device. The control devices may be configured to turn the lighting loads 102, 104 on and off. The control devices may be configured to control the magnitude of a load current conducted through the lighting loads so as to control an intensity of the lighting loads 102, 104 between a low-end intensity $L_{LE}$ and a high-end intensity $L_{HE}$, for example.

The control device described herein may be, for example, a dimmer switch 110, a retrofit remote control device 112, a wall-mounted control device 114, a tabletop remote control device 116, and/or a handheld remote control device 118. The dimmer switch 110 may be configured to be mounted to a standard electrical wallbox (e.g., via a yoke) and be coupled in series electrical connection between a power source (e.g., an alternating-current (AC) power source 105 or a direct-current (DC) power source) and a lighting load that is wired into the control path of the dimmer switch 110 (e.g., such as the lighting load 102). The dimmer switch 110 may receive an AC mains line voltage $V_{AC}$ from the AC power source 105, and may generate a control signal for controlling the lighting load 102. The control signal may be generated via various phase-control techniques (e.g., a forward phase-control dimming technique or a reverse phase-control dimming technique). The dimmer switch 110 may be configured to receive wireless signals (e.g., from a remote control device) representative of commands to control the lighting load 102 (e.g., the intensity and/or color of the lighting load), and generate respective control signals for executing the commands. Examples of wall-mounted dimmer switches are described in greater detail in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The retrofit remote control device 112 may be configured to be mounted to a mechanical switch (e.g., a toggle switch 122, a paddle switch, a pushbutton switch, a "light switch," or other suitable switch) that may be pre-existing in the lighting control system 100. Such a retrofit solution may provide energy savings and/or advanced control features, for example without requiring significant electrical re-wiring and/or without requiring the replacement of existing mechanical switches. As an example, a consumer may replace an existing lamp with the controllable lighting load 104, switch a toggle switch 122 that is coupled to the lighting load 104 to the on position, install (e.g., mount) the remote control device 112 onto the toggle switch 122, and associate the remote control device 112 with the lighting source 104. The retrofit remoted control 112 may then be used to perform advanced functions that the toggle switch 122 may be incapable of performing (e.g., such as dimming the intensity level of the light output, providing feedback to a user, etc.). As shown, the toggle switch 122 is coupled (e.g., via a series electrical connection) between the AC power source 105 and an electrical receptacle 120 into which the lighting load 104 may be plugged (e.g., as shown in FIG. 1). Alternative, the toggle switch 122 may be coupled between the AC power source 105 and one or more of the lighting loads 102, 104, without the electrical receptacle 120. The retrofit remote control device 112 may be operable to transmit the wireless signals to the controllable light source 104 for controlling the intensity and/or color (e.g., color temperature) of the controllable light source 104. The remote control device 112 may also be configured to transmit wireless signals for control of other electrical loads, such as for example, the volume of a speaker and/or audio system, the position of a motorized window treatment, the setpoint temperature of a heating and/or cooling system, and/or a controllable characteristic of another electrical load or device.

The wall-mounted remote control device 114 may be configured to be mounted to a standard electrical wallbox and be electrically connected to the AC power source 105 for receiving power. The wall-mounted remote control device 114 may be configured to receive a user input and may generate and transmit a control signal (e.g., control data such as a digital message) for controlling the lighting loads 102, 104 in response to the user input. The tabletop remote control device 116 may be configured to be placed on a surface (e.g., an end table or night stand), and may be powered by a direct-current (DC) power source (e.g., a battery or an external DC power supply plugged into an electrical outlet). The tabletop remote control device 116 may be configured to receive a user input, and may generate and transmit a signal (e.g., a digital message) for controlling the lighting loads 102, 104 in response to the user input. The handheld remote control device 118 may be sized to fit into a user's hand, and may be powered by a direct-current (DC) power source (e.g., a battery or an external DC power supply plugged into an electrical outlet). The handheld remote control device 118 may be configured to receive a user input, and may generate and transmit a signal (e.g., a digital message) for controlling the lighting loads 102, 104 in response to the user input. Examples of battery-powered remote controls are described in greater detail in commonly assigned U.S. Pat. No. 8,330,638, issued Dec. 11, 2012, entitled "Wireless Battery Powered Remote Control Having Multiple Mounting Means," and U.S. Pat. No. 7,573,208, issued Aug. 11, 2009, entitled "Method Of Programming A lighting Preset From A Radio-Frequency Remote Control," the entire disclosures of which are hereby incorporated by reference.

The control devices described herein (e.g., the dimmer switch 110 and/or remote control devices 112-118) may each include one or more light sources (e.g., LEDs) configured to be illuminated to provide feedback to a user of the control device. Such feedback may indicate, for example, a status of the lighting loads 102, 104 such as whether the lighting loads are on or off, a present intensity of the lighting loads, and so on. The feedback may indicate a status of the control device itself such as a power status of the control device (e.g., remaining battery power). The feedback may indicate to the user that the control device is transmitting control signals (e.g., RF signals) in response to an actuation of the control device. The control device may be configured to keep the one or more light sources illuminated while the condition triggering the feedback continues to exist. The control device may be configured to illuminate the one or more light sources for a few seconds (e.g., 1-2 seconds) and then turn off the light sources (e.g., to conserve battery life).

The control devices may be configured to be dim (e.g., not illuminated) the one or more light sources so that no feedback is provided when the control devices are in an idle state. The control devices may then illuminate the one or more light sources to provide the feedback, in response to detecting a user within close proximity of the control devices. Such detection may be based on, for example, a finger hovering near a front surface of the control devices. The presence of the user may be detected, for example, via a capacitive touch element or an electrical field sensor comprised in the control devices.

The control devices may each include a control circuit. The control circuit may be configured to be responsive to a user input and generate control data (e.g., a control signal) for controlling the lighting loads 102, 104 based on the user input. The control data may include commands and/or other information (e.g., such as identification information) for controlling the lighting loads 102, 104. The control circuit may be configured to illuminate the one or more light sources to provide the feedback described herein.

One or more of the control devices may include a wireless communication circuit (e.g., a radio frequency (RF) transmitter) operable to transmit and/or receive wireless signals such as RF signals 108. The wireless signal may be used to transmit control data (e.g., a digital message) generated by the control devices to the lighting loads 102, 104 or to a central controller of the lighting control system 100, for example. The lighting loads 102, 104 may be associated with a control device during a configuration procedure such that the lighting loads 102, 104 may be responsive to control signals transmitted by the control device. To illustrate, the association may be accomplished by actuating an actuator on the concerned lighting loads, and then actuating (e.g., pressing and holding) an actuator on the control device for a predetermined amount of time (e.g., approximately 10 seconds). Examples of a configuration procedure for associating a control device with an electrical load is described in greater detail in commonly-assigned U.S. Patent Publication No. 2008/0111491, published May 15, 2008, entitled "Radio-Frequency Lighting Control System," the entire disclosure of which is hereby incorporated by reference.

The control devices may each include a memory. The memory may be used, for example, to store operational settings associated with the control device and/or the lighting loads 102, 104. The memory may be implemented as an external integrated circuit (IC) or as an internal circuit (e.g., as part of a control circuit).

The load control system 100 may include one or more of a remote occupancy sensor or a remote vacancy sensor (not shown) for detecting occupancy and/or vacancy conditions in a space surrounding the sensors. The occupancy or vacancy sensors, may be configured to transmit digital messages to the lighting loads 102, 104 (e.g., via the RF signals 108) in response to detecting occupancy or vacancy conditions. Examples of RF load control systems having occupancy and vacancy sensors are described in greater detail in commonly-assigned U.S. Pat. No. 7,940,167, issued May 10, 2011, entitled "Battery Powered Occupancy Sensor," U.S. Pat. No. 8,009,042, issued Aug. 30, 2011, entitled "Radio Frequency Lighting Control System With Occupancy Sensing," and U.S. Pat. No. 8,199,010, issued Jun. 12, 2012, entitled "Method And Apparatus For Configuring A Wireless Sensor," the entire disclosures of which are hereby incorporated by reference.

The load control system 100 may include a remote daylight sensor (not shown) for measuring a total light intensity in the space around the daylight sensor. The daylight sensor may be configured to transmit digital messages, such as a measured light intensity, to the lighting loads 102, 104 such that the lighting loads may be operable to adjust their respective intensities in, response to the measured light intensity. Examples of RF load control systems having daylight sensors are described in greater detail in commonly assigned U.S. patent application Ser. No. 12/727,956, filed Mar. 19, 2010, entitled "Wireless Battery-Powered Daylight Sensor." and U.S. patent application Ser. No. 12/727,923, filed Mar. 19, 2010, entitled "Method Of Calibrating A Daylight Sensor," the entire disclosures of which are hereby incorporated by reference.

The load control system 100 may include other types of input devices, for example, radiometers, cloudy-day sensors, temperature sensors, humidity sensors, pressure sensors, smoke detectors, carbon monoxide detectors, air-quality sensors, security sensors, proximity sensors, fixture sensors, partition sensors, keypads, kinetic or solar-powered remote controls, key fobs, cell phones, smart phones, tablets, personal digital assistants, personal computers, laptops, time clocks, audio-visual controls, safety devices, power monitoring devices (such as power meters, energy meters, utility submeters, utility rate meters), central control transmitters, residential, commercial, or industrial controllers, or any combination of these input devices.

Greater detail about the control devices (e.g., the dimmer switch 110 and/or remote control devices 112-118) will be provided herein with examples of a retrofit remote control device (e.g., such as the retrofit remote control device 112 of FIG. 1). It should be appreciated, however, that features described herein in association with the retrofit remote control device may be applicable to other types of control devices, including wall-mounted dimmer switches (e.g., such as the dimmer switch 110), wall-mounted remote control devices (e.g., such as the wall-mounted remote control 114), tabletop remote control devices (e.g., such as the tabletop remote control 116), handheld remote control devices (e.g., such as the handheld remote control 118), and/or the like.

It should be further appreciated that although FIG. 1 depicts a load control system with one lighting load, the system may include more lighting loads, other types of lighting loads, and/or other types of electrical loads. For example, the load control system may include one or more of the following: a dimming ballast for driving a gas-discharge lamp; an LED driver for driving an LED light source; a dimming circuit for controlling the intensity of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in load control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a setpoint temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; a volume control; an audio system or amplifier; an elevator; a power supply; a generator; an electric charger, such as an electric vehicle charger; an alternative energy controller; and/or the like.

Figure 2:
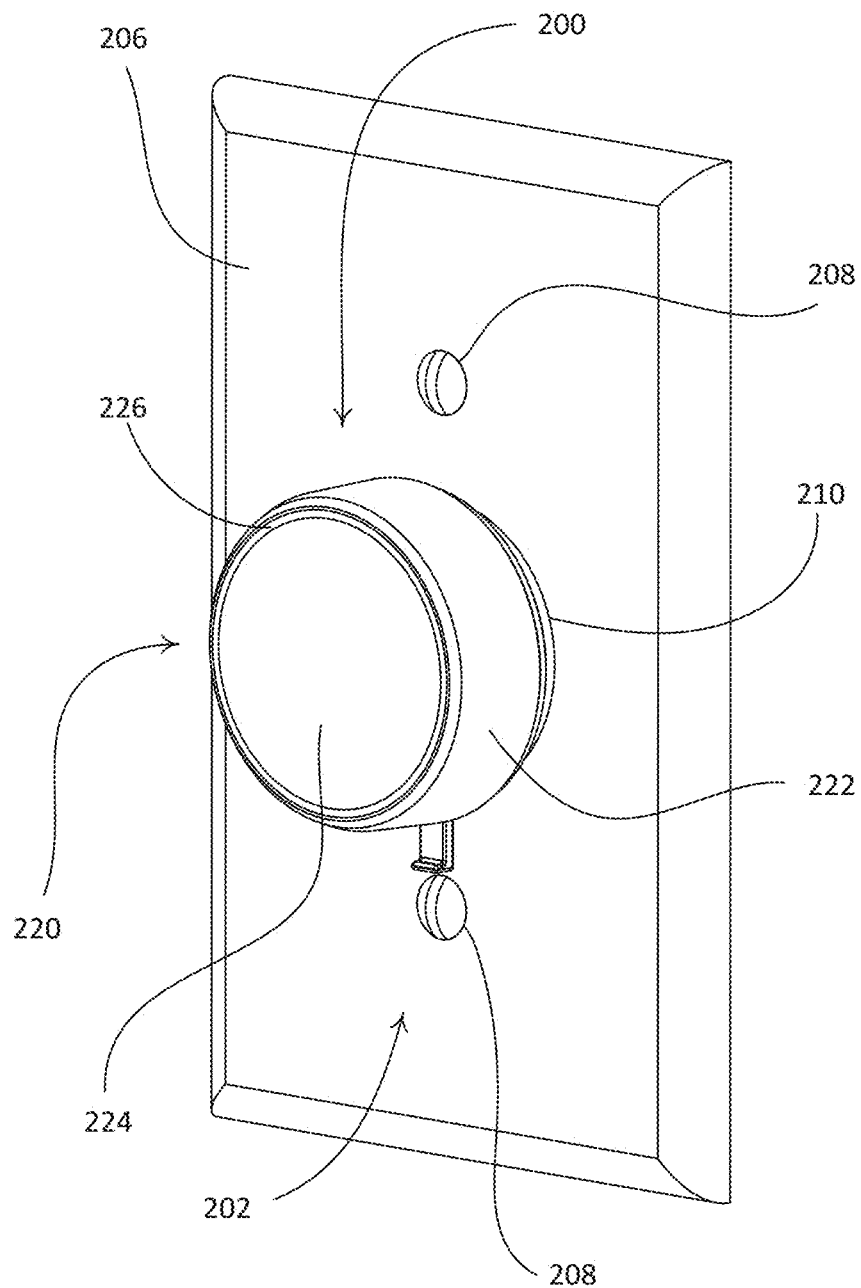
FIG. 2 shows a perspective view of an example control device that may be deployed as one of the control devices depicted in FIG. 1.
Figure 3:
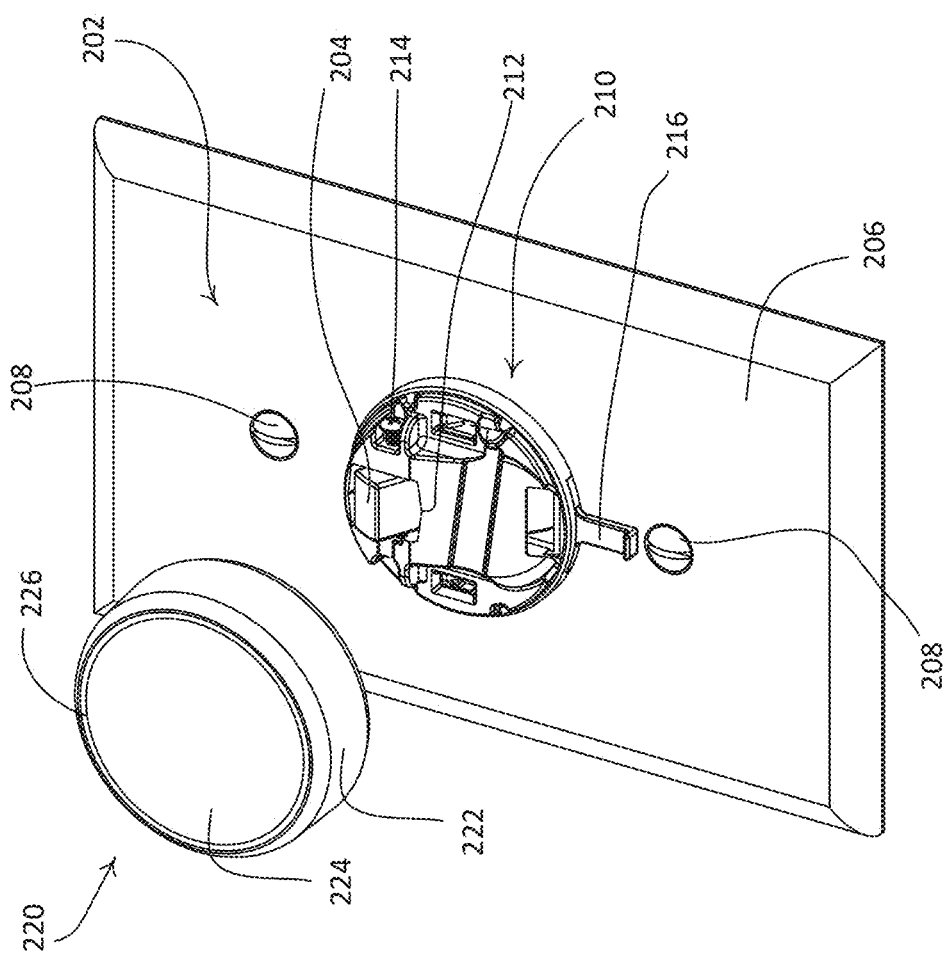
FIG. 3 shows a perspective view of the example control device depicted in FIG. 2 with a control unit detached from a base portion.

FIG. 2 is a perspective view of an example control device 200 that may be deployed as the dimmer switch 110 and/or the retrofit remote control device 112 (e.g., a battery-powered rotary remote control device) in the lighting control system 100. The control device 200 may be configured to be mounted over an actuator of a standard light switch 202 (e.g., the toggle switch 122 shown in FIG. 1). The control device 200 may be installed over of an existing faceplate 206 that is mounted to the light switch 202 (e.g., via faceplate screws 208). The control device 200 may include a base portion 210 and a control unit 220 (e.g., a control module) that may be operably coupled to the base portion 210. The control unit 220 may be mounted over the base portion 210, and supported by the base portion 210. The control unit 220 may include a rotating portion 222 (e.g., an annular rotating portion) that is rotatable with respect to the base portion 210. FIG. 3 is a perspective view of the control device 200 with the control unit 220 detached from the base portion 210. The base portion 210 may be attached (e.g., fixedly attached) to a toggle actuator 204 and may be configured to maintain the toggle actuator 204 in the on position. The toggle actuator 204 may be received through a toggle actuator opening 212 in the base portion 210. A screw 214 may be tightened to attach (e.g., fixedly attached) the base portion 210 to the toggle actuator 204. In this regard, the base portion 210 may be configured to prevent a user from inadvertently switching the toggle actuator 204 to the off position when the control device 200 is attached to the light switch 202. The control unit 220 may be released from the base portion 210. For example, a control unit release tab 216 may be provided on the base portion 210 or on the control unit 220. By actuating the control unit release tab 216 (e.g., pushing up towards the base portion or pulling down away from the base portion), a user may remove the control unit 220 from the base portion 210.

Figure 4:
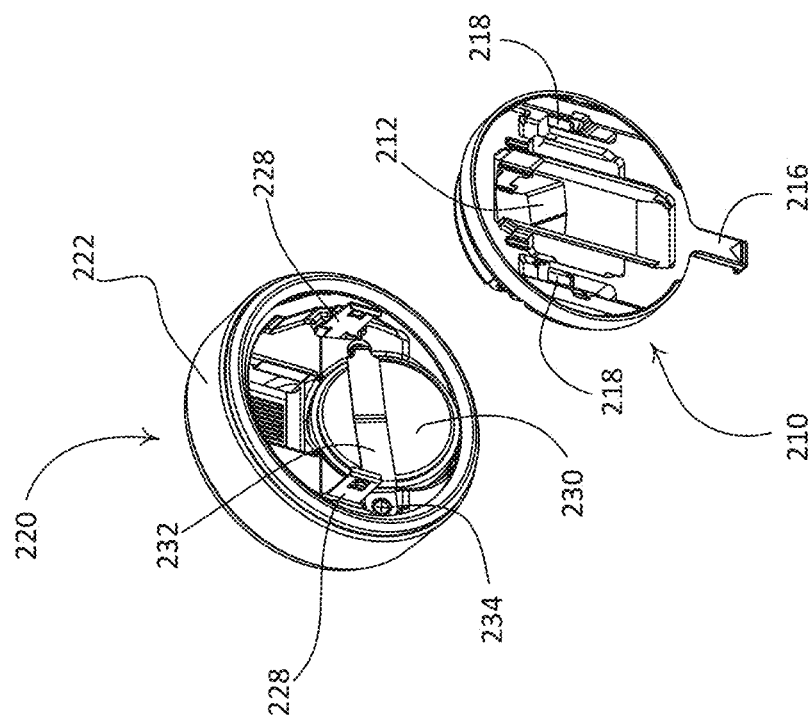
FIG. 4 shows rear views of the control unit and the base portion depicted in FIG. 3.

FIG. 4 provides rear views of the base portion 210 and the control unit 220 of the control device 200. The control unit 220 may comprise one or more clips 228 that may be retained by respective locking members 218 connected to the control unit release tab 216 when the base portion 210 is in a locked position. The one or more clips 228 may be released from the respective locking members 218 of the base portion 210 when the control unit release tab 216 is actuated (e.g., pushed up towards the base portion or pulled down away from the base portion) to put the base portion 210 in an unlocked position. In an example, the locking members 218 may be spring biased into the locked position and may automatically return to the locked position after the control unit release tab 216 is actuated and released. In an example, the locking members 218 may not be spring biased, in which case the control unit release tab 216 may be actuated to return the base portion 210 to the locked position.

The control unit 220 may be installed (e.g., mounted) on the base portion 210 without adjusting the base portion 210 to the unlocked position. For example, the one or more clips 228 of the control unit 220 may be configured to flex around the respective locking members 218 of the base portion and snap into place, such that the control unit is fixedly attached to the base portion.

The control unit 220 may be released from the base portion 210 to access a battery compartment (e.g., a battery recess) configured to hold a battery 230 that provides power to the control device 200. The battery 230 may be held in place in various ways. For example, the battery 230 may be held by a battery retention strap 232, which may also operate as an electrical contact for the batteries. The battery retention strap 232 may be loosened by untightening a battery retention screw 234 to allow the battery 230 to be removed and replaced. Although FIG. 4 depicts the battery 230 as being located in the control unit 220, it should be appreciated that the battery 230 may be placed elsewhere in the control device 200 (e.g., in the base portion 210) without affecting the functionality of the control device 200. Further, more than one battery may be provided. For instance, a spare battery may be provided (e.g., stored inside the control unit 220) as replacement for the battery 230.

When the control unit 220 is coupled to the base portion 210 as shown in FIG. 2, the rotating portion 222 may be rotatable in opposed directions about the base portion 210

(e.g., in the clockwise or counter-clockwise directions). The base portion 210 may be configured to be mounted over the toggle actuator 204 of the switch 202 such that the rotational movement of the rotating portion 222 may not change the operational state of the toggle actuator 204 (e.g., the toggle actuator 204 may remain in the on position to maintain functionality of the control device 200).

The control unit 220 may comprise an actuation portion 224 or the entire control unit 220 may function as an actuation portion 224. The actuation portion 224 may comprise a part or an entirety of a front surface of the control unit 220. In an example, the control unit 220 may have a circular surface within an opening defined by the rotating portion 222. In another example, the rotating portion 222 and/or the surface of the control unit 220 may have a different shape (e.g., oval, square, hexagonal, etc.). The actuation portion 224 may occupy a part or an entirety of the circular surface (e.g., as a center button occupying a central area of the circular surface). The actuation portion 224 may be configured to move in toward the light switch 202 (e.g., move towards the base portion 210 along an axis perpendicular to the base portion 210) to actuate a mechanical switch (not shown) inside the control unit 220 (e.g., as will be described in greater detail below). The actuation portion 224 may return (e.g., move away from the base portion 210 along an axis perpendicular to the base portion 210) to an idle position after being actuated. As the actuation portion 224 moves in and out relative to the base portion 210, the rotating portion 222 may maintain its position (e.g., remain in a same plane parallel to the plane of the base portion 210) or move in and out with the actuation portion 224. In an example, the front surface of the actuation portion 224 may be a touch sensitive surface (e.g., a capacitive touch surface). The touch sensitive surface may be realized by including a touch sensitive element (e.g., a capacitive touch element or an electrical field sensor) near (e.g., adjacent to) the rear surface of the actuation portion. The touch sensitive element may be actuated in response to a touch of the touch sensitive surface of the actuation portion 224 or upon detection of a user in the proximity of the touch sensitive surface.

The control device 200 may be configured to transmit one or more wireless communication signals (e.g., the RF signals 108) to a load regulation device (e.g., such as driver circuits in the lighting loads 102, 104). The control device 200 may include a wireless communication circuit (e.g., an RF transceiver or transmitter) via which the one or more wireless communication signals may be sent. The control unit 220 may be configured to transmit digital messages via the one or more wireless communication signals. For example, the control unit 220 may comprise a control circuit configured to be responsive to, a movement of the actuation portion 224 and/or the rotating portion 222. The control circuit may be configured to transmit a command (e.g., a control signal) to raise the intensity of a light source in response to a clockwise rotation of the rotating portion 222 and to transmit a command (e.g., a control signal) to lower the intensity of the light source in response to a counter-clockwise rotation of the rotating portion 222. The control circuit may be configured to increase or decrease the intensity of the light source by a predetermined amount in response to a partial rotation (e.g., an approximately 45-degree rotation) of the rotating portion 222 in either a clockwise direction or a counterclockwise direction. The rotating portion 222 may be configured to return to an idle position (e.g., a center position) after the rotation of the rotating portion 222.

The control unit 220 may be configured to transmit a command to toggle a light source from off to on, or vice versa, in response to an actuation of the actuation portion 224. For example, the control unit 220 may be configured to transmit a command to turn the lighting loads 102, 104 on in response to an actuation of the actuation portion 224 (e.g., if the control unit 220 possesses information indicating that the controllable light source is presently off). The control unit 220 may be configured to transmit a command to turn the lighting loads 102, 104 off in response to an actuation of the actuation portion 224 (e.g., if the control unit possesses information indicating that the controllable light source is presently on). The control unit 220 may be configured to transmit a command to turn the controllable light source on to full intensity in response to a special actuation of the actuation portion 224 (e.g., a double tap or two actuations in quick succession). In examples, the actuation portion 224 may include separate parts for turning the lighting loads 102, 104 on and off. For instance, the actuation portion 224 may include an on button in the upper half of the actuation portion 224 and an off button in the bottom half of the actuation portion 224. The control unit 220 may be configured to transmit a command to turn the lighting loads 102, 104 on in response to an actuation of the on button and to turn the lighting loads 102, 104 off in response to an actuation of the off button.

The control unit 220 may be configured to adjust the intensity of a lighting load to a minimum intensity in response to rotation of the rotating portion 222 and may only turn off the lighting load in response to an actuation of the actuation portion 224. Alternatively or additionally, the control unit 220 may be configured to include a spin-to-off mode, in which the control unit 220 may turn off the lighting load after the intensity of the lighting load is controlled to a minimum intensity in response to a rotation of the rotating portion 222. The minimum intensity at which the lighting load is to be turned off may be configured by a user. The control unit 220 may be configured to transmit a command (e.g., via one or more wireless communication signals such as the RF signal 118) to adjust the color of a light source (e.g., the lighting loads 102, 104).

Although description of the various operations provided herein refers generally to the control device 200 and/or the control unit 220, it will be appreciated that the various operations may be carried out via one or more electrical components comprised in the control device 200 or the control unit 220. For instance, the control unit 220 may comprise, a control circuit configured to be responsive to a movement of the actuation portion 224 and/or the rotating portion 222. The control circuit may be configured to generate control data (e.g., a control signal) for controlling a controllable light source in accordance with the functions described herein for the actuation portion 224 and/or the rotating portion 222. The control circuit may be configured to cause the control data to be transmitted to the controllable light source (e.g., via a wireless communication circuit). The control circuit may be configured to trigger a feedback event (e.g., by illuminating a light bar, as described herein) in response to a user manipulation of the control device 200. The control circuit may be configured to provide the feedback only in the presence of a user (e.g., when the user is within close proximity of the control device 200). The control circuit may be configured to detect and indicate that the battery power of the control device 200 is low.

The control unit 220 may comprise one or more visual indicators that may be illuminated to provide feedback to a user of the control device 200. The feedback may indicate an operational state (e.g., battery status, an operating parameter or setting, an operational node, etc.) of the control device 200 and/or an electrical load controlled by the control device 200. For example, the feedback may indicate an intensity of a lighting load controlled by the control device 200. The one or more visual indicators may be illuminated by a single light source (e.g., a single LED) or by a plurality of light sources (e.g., multiple LEDs). For example, the one or more visual indicators may be implemented as a light bar 226 (e.g., that is illuminated by one or more LEDs). The light bar 226 may be placed in various locations of the control device 200, such as between the rotating portion 222 and the actuation portion 224 (e.g., attached to a periphery of the actuation portion 224). The light bar 226 may extend along the perimeter of the rotation portion 222 and/or the actuation portion 224, and/or be configured to move with the actuation portion 224 (e.g., when the actuation portion is actuated). The light bar 226 may have different shapes and/or other geometric properties. For example, the light bar 226 may form a complete or partial loop, the light bar 226 may be linear (e.g., substantially linear), the light bar 226 may have an irregular shape such as an irregular curve or twist, and/or the like. As referenced herein, a loop can be but is not required to be circular or curving. A complete loop may form a circle (e.g., as shown in FIGS. 2 and 3), an oval, a rectangle, a triangle, a star, a diamond, etc., and a partial loop may include one or more parts of the forgoing structures.

Figure 5:
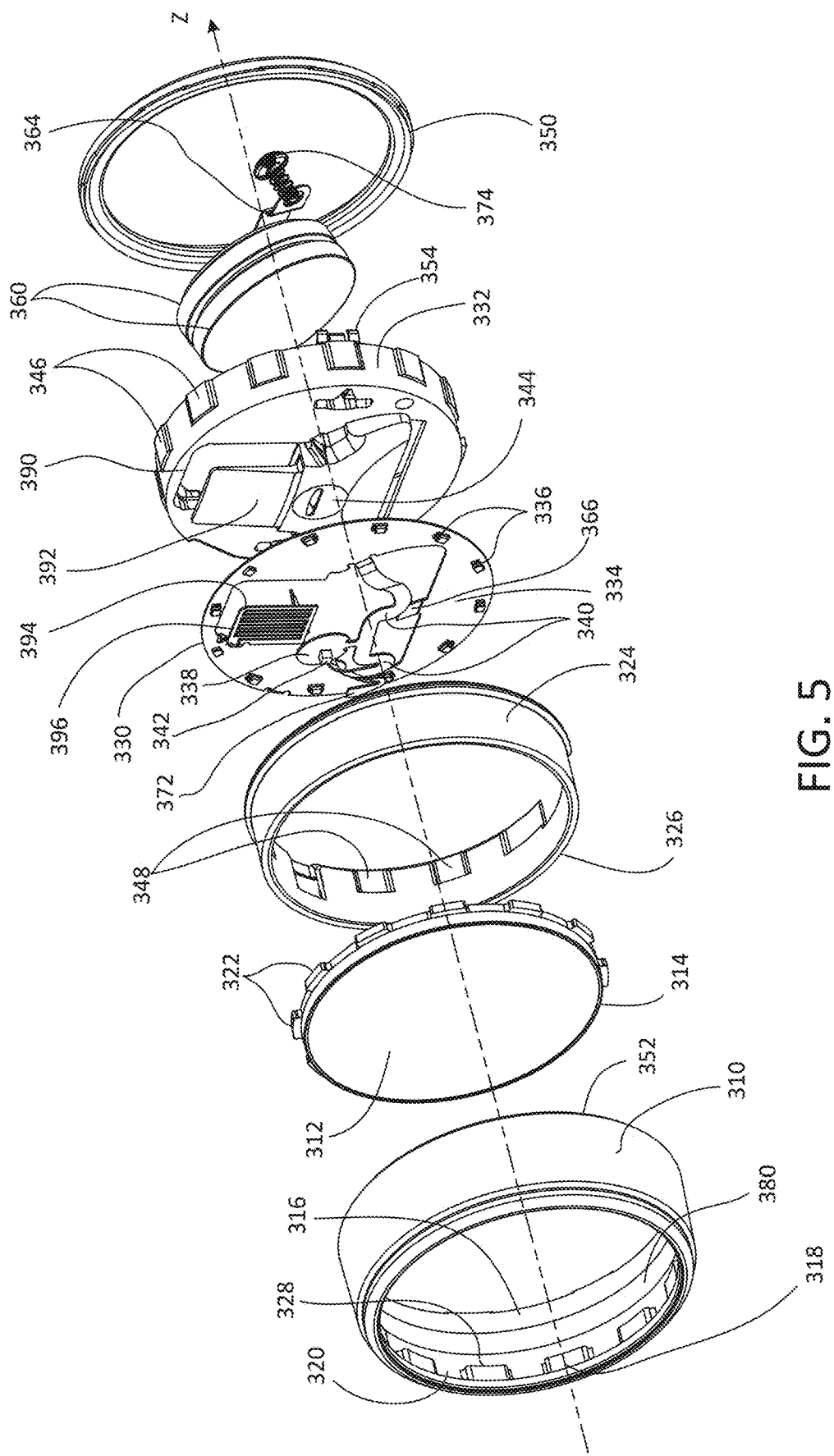
FIG. 5 shows a front exploded view of an example control unit for the example control device depicted in FIG. 2.
Figure 6:
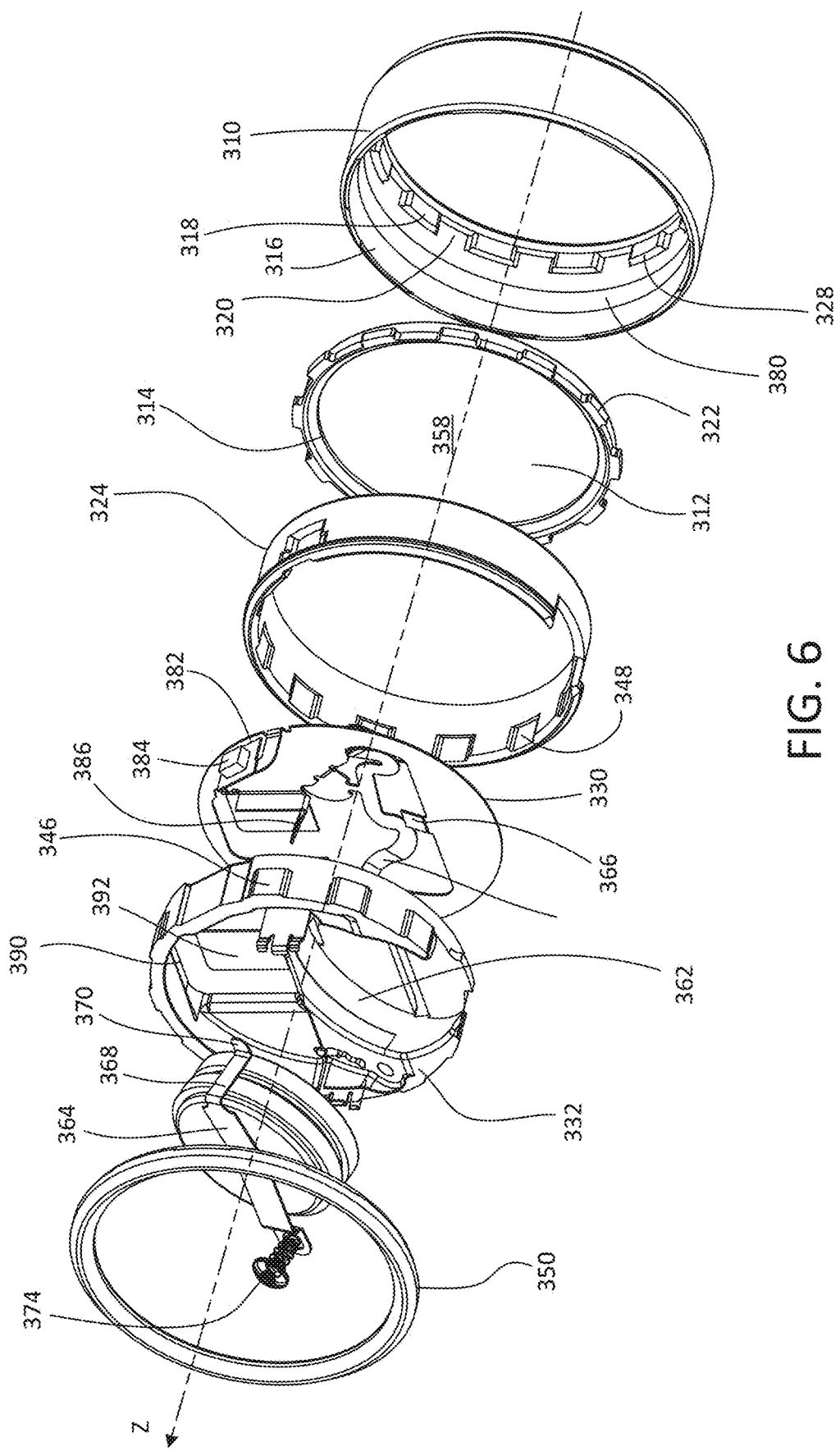
FIG. 6 shows a rear exploded view of an example control unit for the example control device depicted in FIG. 2.

FIG. 5 is a front exploded view and FIG. 6 is a rear exploded view of an example control unit 300 for a control device (e.g., the control unit 220 of the control device 200 shown in FIGS. 2-4). The control unit 300 may be configured to be operably coupled to and supported by a base portion of the control device (e.g., such as, the base portion 210 of the control device 200). The base portion may be mounted over a toggle actuator of a standard light switch.

The control unit 300 may comprise an annular rotating portion 310 (e.g., such as the rotation portion 222) and an actuation portion 312 (e.g., such as the actuation portion 224) that may be received within an opening defined by the rotating portion. The control unit 300 may further comprise a light bar 314 (e.g., a circular light bar) attached to the actuation portion 312 around a periphery of the actuation portion. The rotating portion 310 may comprise an inner surface 316 having tabs 318 surrounding the circumference of the rotation portion. The tabs 318 may be separated by notches 320 that are configured to receive engagement members 322 of the actuation portion 312 to thus engage the actuation portion 312 with the rotating portion 310. The control unit 300 may also comprise a bushing 324 that is received within the rotating portion 310, such that an upper surface 326 of the busing may contact lower surfaces 328 of the tabs 318 inside of the rotating portion.

When the actuation portion 312 is received within the opening of the rotating portion 310, the light bar 314 may be provided between the actuation portion 312 and the rotating portion 310. When the rotating portion 312 is rotated, the actuation portion 312 and/or the light bar 314 may rotate with the rotating portion. The engagement members 322 of the actuation portion 312 may be able to move through the notches 320 in a z-direction (e.g., towards the base portion), such that the actuation portion 312 (along with the light bar 314) may be able to move in the z-direction.

The control unit 300 may further comprise a printed circuit board (PCB) (e.g., a flexible printed circuit board (PCB) 330) that may be arranged over a carrier 332. The flexible PCB 330 may comprise a main portion 334 on which most of the control circuitry of the control unit 300 (e.g., including a control circuit) may be mounted. The control unit 300 may comprise a plurality of light-emitting diodes (LEDs) 336 arranged around the perimeter of the flexible PCB 330 to illuminating the light bar 314. The flexible PCB 330 may comprise a switch tab 338 that may be connected to the main portion 334 (e.g., via flexible arms 340). The switch tab 338 may have a mechanical tactile switch 342 mounted thereto. The switch tab 338 of the flexible PCB 330 may be configured to rest on a switch tab surface 344 on the carrier 332. The carrier 332 may comprise engagement members 346 configured to be received within notches 348 in the bushing 324. A ring 350 may snap to a lower surface 352 of the rotating portion to hold the control unit 300 together. The control unit 300 may further comprise clips 354 that may be attached to the carrier 332 to allow the control unit to be connected to the base portion.

When the actuation portion 312 is pressed, the actuation portion 312 may move along the z-direction until an inner surface 358 of the actuation member actuates the mechanical tactile switch 342. The actuation portion 312 may be returned to the idle position by the mechanical tactile switch 342. In addition, the control unit 300 may comprise an additional, return spring for returning the actuation portion 312 to the idle position.

The control unit 300 may be powered by one or more batteries 360 adapted to be received within a battery recess 362 (e.g., a battery compartment) in the carrier 332 as, shown in FIG. 6. The batteries 360 may be held in place by a battery retention strap 364, which may also operate as a negative electrical contact for the batteries and tamper resistant fastener for the batteries. The flexible PCB may comprise a contact pad 366 that may operate as a positive electrical contact for the batteries 360. The battery retention strap 364 may comprise a leg 368 that ends in a foot 370 that, may be electrically connected to a flexible pad 372 (e.g., as shown in FIG. 5) on the flexible PCB 330. The battery retention strap 364 may be held in place by a battery retention screw 374 received in an opening 376 in the carrier 332. When the battery retention screw 374 is loosened and removed from the opening 376, the flexible pad 372 may be configured to move (e.g., bend or twist) to allow the battery retention strap 364 to move out of the way of the batteries 360 to allow the batteries to be removed and replaced.

The control unit 300 may further comprise a magnetic strip 380 located on the inner surface 316 of the rotating portion 310 and extending around the circumference of the rotating portion. The flexible PCB 330 may comprise a pad 382 (e.g., in the form of a wing or a flap) on which a rotational sensor (e.g., a Hall effect sensor integrated circuit 384) may be mounted. The pad 382 may be arranged perpendicular to the main portion 334 of the flexible PCB 330 as shown in FIG. 6. The magnetic strip 380 may comprise a plurality of alternating positive and negative sections, and the Hall effect sensor integrated circuit 384 may comprise two sensor circuits operable to detect the passing of the positive and negative sections of the magnetic strip as the rotating portion 310 is rotated. Accordingly, the control circuit of the control unit 330 may be configured to determine the rotational speed and direction of rotation of the rotation portion 310 in response to the Hall effect sensor integrated circuit 384. The flexible PCB 330 may also comprise a programming tab 386 to allow for programming of the control circuit of the control unit 330.

As shown in FIG. 6, the carrier 332 may comprise an actuator opening 390 adapted to receive the toggle actuator of the light switch when the control unit 300 is mounted to the base portion. The carrier 332 may comprise a flat portion 392 that may prevent the toggle actuator of the light switch from extending into the inner structure of the control unit 300 (e.g., if the toggle actuator is particularly long). The flexible PCB 330 may also comprise an antenna 394 on an antenna tab 396 that may lay against the flat portion 392 in the actuator opening 390 (e.g., as shown in FIG. 5).

The load control device described herein may be configured to include a feedback mechanism to inform a user of the load control device about the type and/or amount of control being, applied, a status (e.g., remaining battery power) of the load control device, and/or an operational state of one or more electrical loads controlled by the load control device (e.g., on/off state, intensity level, etc.). Providing such a feedback mechanism may allow a user to more precisely control an electrical load, keep the user informed about the status of the electrical load and/or the load control device itself, and enhance the aesthetical appeal of the load control device.

FIGS. 7-10 show front views of the control device 200 that illustrate how one or more light sources (e.g., LEDs) of the control device 200 may be illuminated to provide feedback about the control device 200. The one or more light sources may be controlled to illuminate the light bar 226. The feedback may be associated with various operational aspects of the control device 200 and/or an electrical load controlled by the control device 200. For instance, the control device 200 (e.g., a control circuit included therein) may be configured to illuminate the light bar 226 to indicate the type of control (e.g., intensity control) being applied, a direction of the control (e.g., raising or lowering an intensity), and/or an amount of adjustment (e.g., a target intensity) being made.

Figure 7:
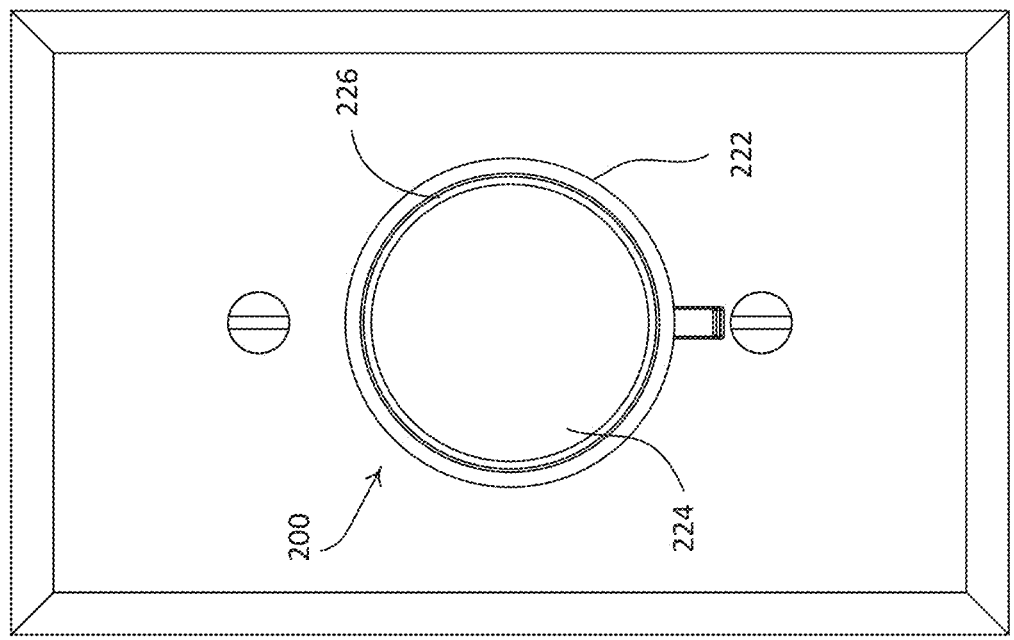
FIG. 7 shows a front view of the example control device depicted in FIG. 2.

FIG. 7 shows a front view of the control device 200 when the light bar 226 is illuminated to provide the feedback described herein. A control circuit of the control device 200 may be configured to provide the feedback after the control device 200 has been activated (e.g., upon detecting a user near the control device and/or upon an actuation of the actuation portion 224 or rotating portion 222). The feedback may indicate that the control device 200 is transmitting wireless communication signals (e.g., the RF signals 108) in response to the activation. The control circuit may keep the light bar 226 illuminated for the duration of the event that triggered the feedback (e.g., while the rotating portion is being rotated). The control circuit may be configured to continue to illuminate the light bar 226 for a few seconds (e.g., 1-2 seconds) after the event, and then turn off the light bar 226 to conserve battery life.

Figure 8:
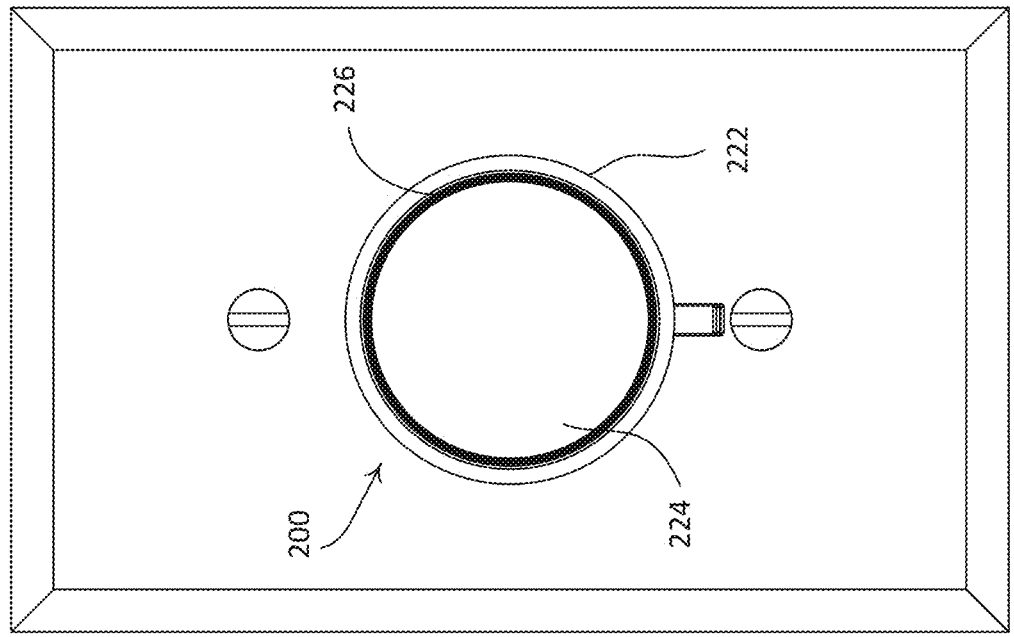
FIG. 8 shows another front view of the example control device depicted in FIG. 2 with a light bar fully illuminated.
Figure 10:
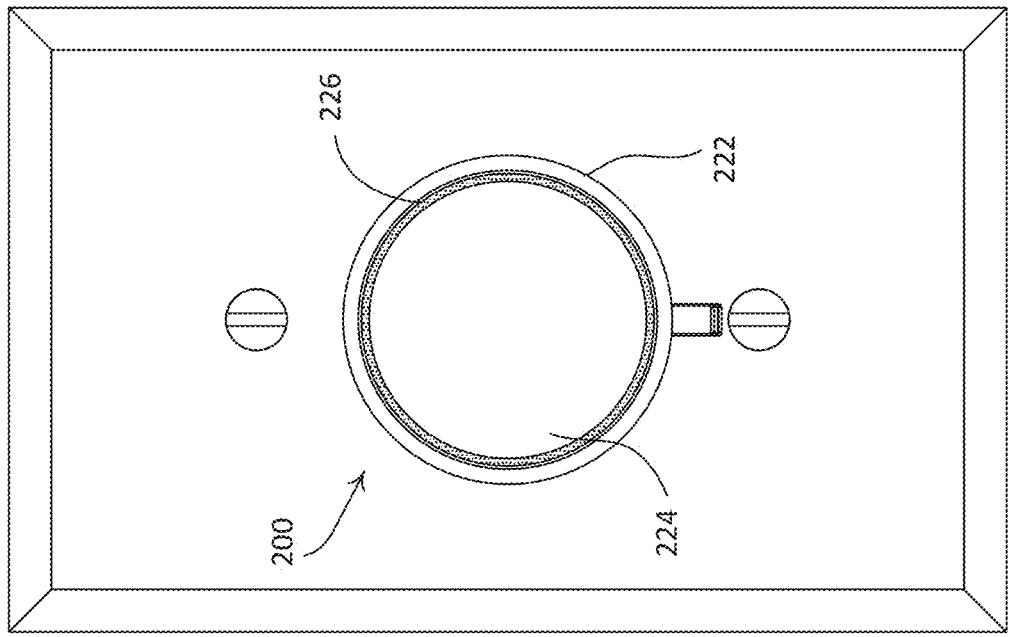
FIG. 10 shows another front view of the example control device depicted in FIG. 2 with a light bar partially illuminated at a second intensity.
Figure 9:
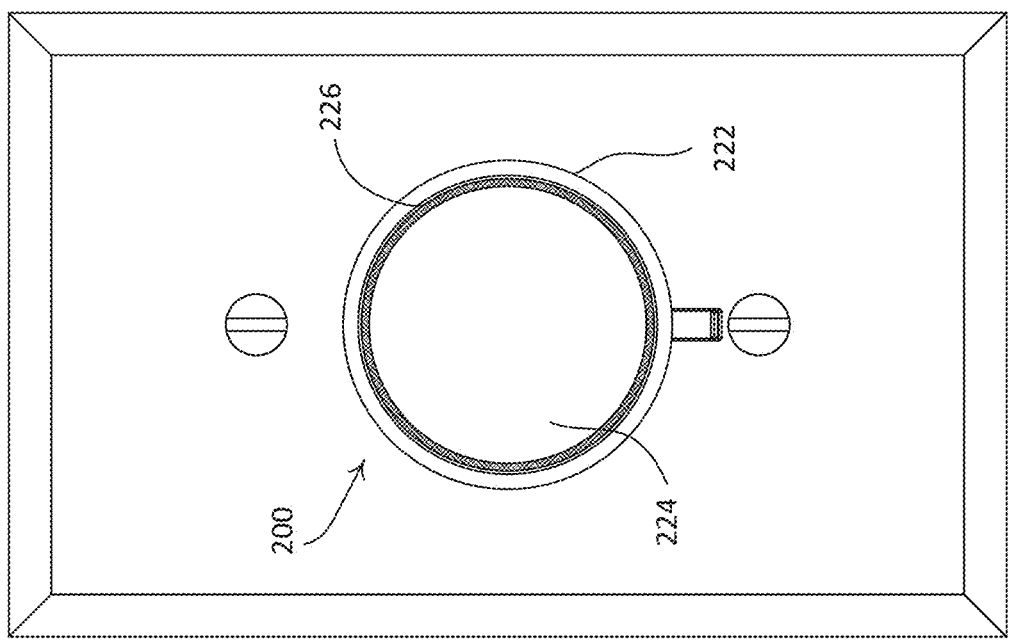
FIG. 9 shows another front view of the example control device depicted in FIG. 2 with a light bar partially illuminated at a first intensity.

The light bar 226 may be illuminated to provide the feedback in different manners (e.g., different intensities and/or colors) when the rotating portion 222 is being rotated to raise or lower the intensity of the lighting load. For example, as shown in FIG. 8, the light bar 226 may be fully illuminated to and maintained at a maximum light bar, intensity $L_{LB-MAX}$ (e.g., 100%) when the rotating portion 222 is being rotated to raise the intensity of the lighting load. The light bar 226 may be illuminated to and maintained at an intensity less than the maximum light bar intensity $L_{LB-MAX}$ (e.g., 40%) when the rotating portion 222 is being rotated to lower the intensity of the lighting load. As another example, the light bar 226 may be illuminated to a first mid-level light bar intensity $L_{LB-MID1}$ (e.g., 80%) that is less than the maximum light bar intensity $L_{LB-MAX}$ when the rotating portion 222 is being rotated to raise the intensity of the lighting load (e.g., as shown in FIG. 9). The light bar 226 may be illuminated to a second mid-level light bar intensity $L_{LB-MID2}$ (e.g., 40%) that is less than the first mid-level light bar intensity $L_{LB-MID1}$ (and thus less than the maximum light bar intensity $L_{LB-MAX}$) when the rotating portion 222 is being rotated to lower the intensity of the lighting load, as shown in FIG. 10.

Similarly, the light bar 226 may be illuminated with different colors to indicate that the intensity of the lighting load is being raised or lowered. For example, the light bar 226 may be illuminated with a red color when the intensity is raised and with a blue color when the intensity is lowered.

Figure 11:
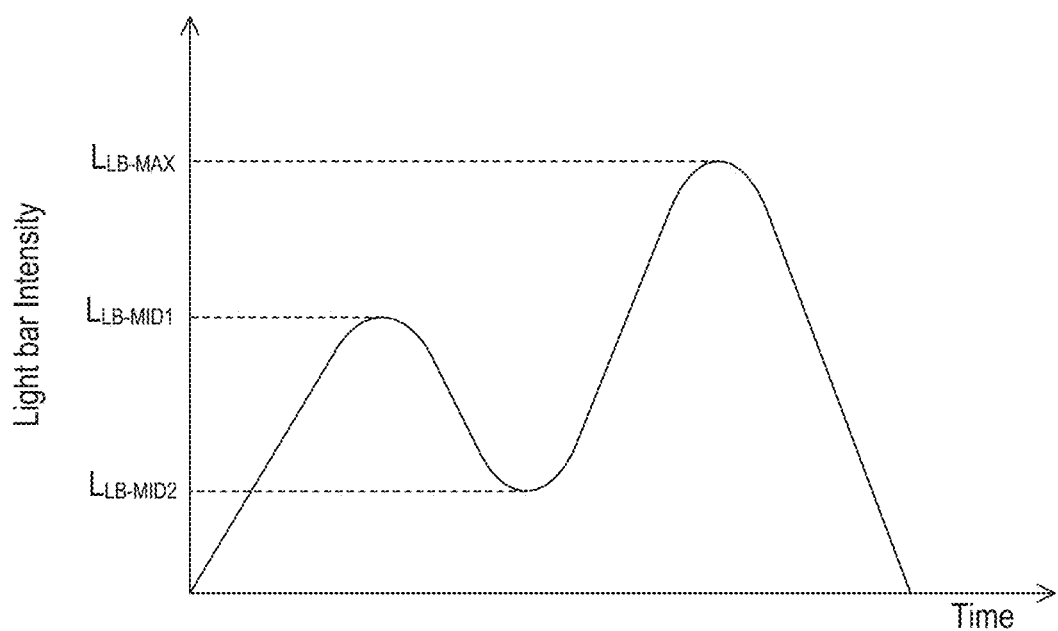
FIG. 11 shows an example plot of the intensity of a light bar with respect to time in order to generate a heartbeat animation.

The light bar 226 may be illuminated in response to an actuation of the actuation portion 224 to indicate that the lighting load is being toggled on or off. For example, the light bar 226 may be illuminated to display an animation (e.g., a heartbeat animation) when the lighting load is being toggled on or off. FIG. 11 shows an example plot of the intensity of the light bar 226 with respect to time in order to generate the animation. For example, the intensity of the light bar 226 may be quickly increased to a first intensity (e.g., the first mid-level light bar intensity $L_{LB-MID1}$ as shown in FIG. 9), quickly decreased to a second intensity (e.g., the second mid-level light bar intensity $L_{LB-MID2}$ as shown in FIG. 10), quickly increased to a third intensity (e.g., the maximum light bar intensity $L_{LB-MAX}$ as shown in FIG. 8), and then quickly turned off. When the control unit 220 is operating in a spin-to-off mode, the light bar 226 may also be illuminated to display an animation (e.g., the heartbeat animation described herein) when the intensity of the lighting load has reached a minimum intensity and is being turned off.

The light bar 226 may be illuminated to further indicate an amount of adjustment being applied to the light intensity. For example, instead of illuminating the entire light bar 226, the control circuit of the control device 200 may illuminate a portion of the light bar 226, and adjust the length of the illuminated portion in accordance to control applied by a user. For example, when the light bar is configured to have a circular shape, the illuminated portion may expand or contract around the circumference of the light bar 226 in response to adjustments of the light intensity. The control circuit may also be configured to adjust the intensity of the LED that is illuminating an end point of the illuminated portion to, provide fine-tune adjustment of the position of the end point of the illuminated portion as will be described in greater detail below.

Figure 12C:
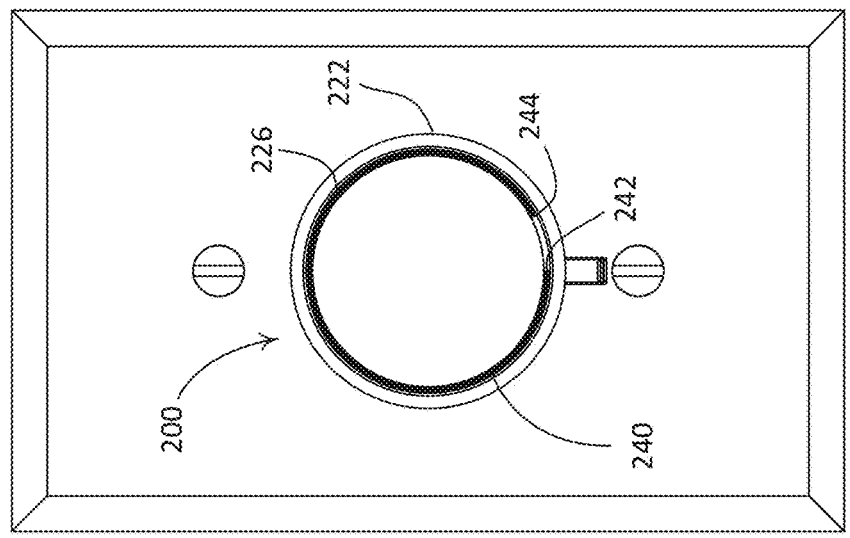
FIGS. 12A-12C show front views of the example control device depicted in FIG. 2 when a light bar is illuminated to expand and contract in one direction to provide an intensity indication on the light bar.
Figure 12B:
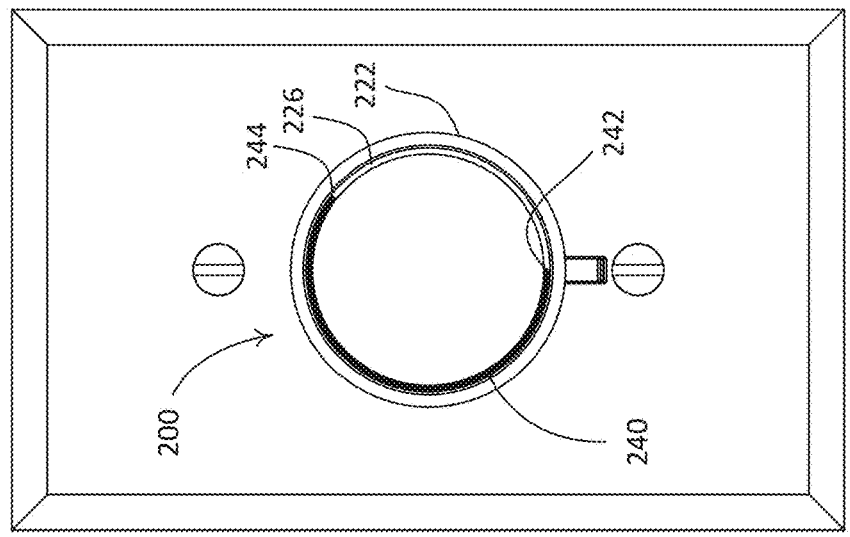
Figure 12A:
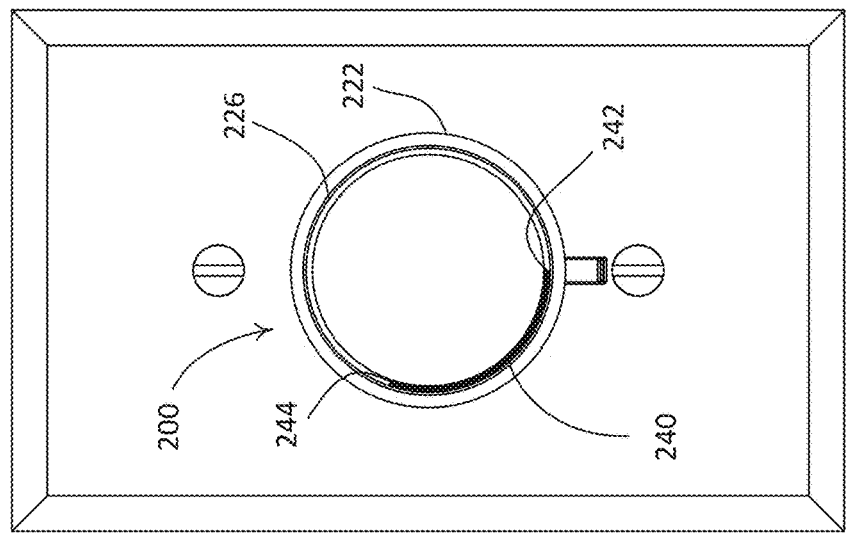

FIGS. 12A-12C show front views of the control device 200 when the light bar 226 is illuminated to expand and contract in one direction to provide an indication (e.g., a single indication) of the intensity of a lighting load. For example, the control device 200 may include a plurality of light sources (e.g., LEDs) configured to illuminate the light bar 226. In response to an actuation of the control device 200 to adjust the intensity of the lighting load, the control device 200 (e.g., the control circuit included therein) may illuminate a subset of the light sources such that a portion 240 of the light bar 226 is illuminated to indicate the intensity corresponding to the actuation. The illuminated portion 240 may begin at a starting point 242 (e.g., at the bottom of the light bar 226 as shown in FIG. 12A) sand end at an end point 244 (e.g., along the circumference of the light bar 226). The length and/or intensity of the illuminated portion 240 may be indicative of the intensity of the lighting load. The subset of light sources may be illuminated uniformly to a common intensity. Alternatively, the subset of light sources may be illuminated to different intensities. For example, the control circuit may illuminate the end point 244 of the illuminated portion of the light bar 226 to a higher intensity than the rest of the illuminated portion and may decrease the intensity of the illuminated portion towards the starting point 242. For example, the illuminated portion of the light bar 226 may display a gradient from the brightest intensity at the end point 244 to the dimmest intensity at the starting point 242. This way, a user may still receive feedback based on the length of the illuminated portion, but less battery power is consumed to provide the feedback. Alternatively, the dimmest intensity, may be between the end point 244 and the starting point 242.

To illustrate, the control circuit of the control device 200 may be configured to increase the length of the illuminated portion 240 (e.g., cause the end point 244 of the illuminated portion to move in a clockwise direction as shown in FIGS. 12A-12C) when the intensity of the lighting load is being raised. The control circuit may be configured to decrease the length of the illuminated portion 240 (e.g., cause the end point 244 of the illuminate portion to move in a counter-clockwise direction as shown in FIGS. 12A-12C) when the intensity of the lighting load is, being lowered. This way, the illuminated portion 240 may expand and contract as the intensity of the lighting load is adjusted. For example, the light bar 226 may be illuminated to indicate that the intensity of the lighting load is approximately 30% as shown in FIG. 12A, approximately 60% as shown in FIG. 12B, and approximately 90% as, shown in FIG. 12C. When the lighting load is at full intensity (e.g., approximately full intensity), the entire light bar 226 may be illuminated. When the control device 200 is configured to control multiple lighting loads, and set respective light intensities of the multiple lighting loads to different values, the control device 200 may be configured to illuminate the light bar 226 to indicate an average of the respective intensities of the lighting loads, to indicate the intensity of a lighting load nearest to the control device 200, and/or the like.

In some examples, the control circuit of the control device 200 may be configured to adjust the intensity of the light source illuminating the end point 244 of the illuminated portion 240 to provide fine-tune adjustment of the position of the end point 244. For example, the control circuit may adjust the intensity of the light source that illuminates the end point 244 between 1% and 100% to provide fine-tune adjustment of the position of the end point 244. To illustrate, the control circuit may illuminate the light bar 226 to the length shown in FIG. 12A to indicate that the intensity of the lighting load is at approximately 30%. At that point, the intensity of the light source illuminating the end point 244) may be set at 1%. As the intensity of the lighting load is further adjusted toward 40%, the control circuit may adjust the intensity of the end point 244 between 1% and 100% with finer granularity to correspond to respective intermediate intensity levels that are between 30% and 40%. After the intensity of the lighting load reaches 40%, the control circuit may illuminate an additional light source (e.g., to 1% intensity) to cause the length of the illuminated portion to expand. The control circuit may then adjust the intensity of the additional light source that is now illuminating the end point 244 between 1% and 100% as the intensity of the lighting load is being tuned towards a next level (e.g., 50%).

The control device 200 may be configured to indicate a last-known intensity of the lighting load upon receiving a user input to turn on the lighting load. For example, before the lighting load was turned off, the control circuit 200 may store the intensity of the lighting load in a memory of the control device 200 while quickly decreasing the length of the illuminated portion 224 from the end point 244 to the starting point 242. Subsequently, when the control device 200 is actuated to turn the lighting load back on, the control device 200 may illuminate the light bar 226 to quickly increase the length of the illuminated portion 224 to correspond to the previously stored intensity of the lighting load.

In the examples described above, the display of the illuminated portion 240 may be obstructed by a user's fingers that are manipulating the control device 200. For instance, as the user rotates the rotating portion 222 of the control device 200 to adjust the intensity of the lighting load, the user's hand may block the leading edge (e.g., the end point 244) of the illuminated portion 240. As a result, the user may not be able to determine whether the illuminated portion is expanding and contracting in response to the rotational movement of the rotating portion 222, and whether the intensity of the lighting load is being adjusted properly.

The control device 200 (e.g., the control circuit included therein) may control the manner in which the light bar 226 is illuminated to reduce the likelihood that a user's action may interfere with the intensity indication. For example, the control circuit of the control device 200 may be configured to cause the end point 244 of the illuminated portion 240 (e.g., as shown in FIGS. 12A-12C) to move at a faster or slower angular speed than that of the rotating portion 222 when the rotating portion is rotated. To illustrate, a user may, within a unit of time, rotate the rotating portion 222 by x degrees in order to adjust the intensity (e.g., raise or lower) of the lighting load. In response, the control circuit may, within the same unit of time, cause the end point 244 of the illuminated portion 240 to move by x+y or x-y degrees (e.g., in clockwise or counterclockwise direction) such that the leading edge of the illuminated portion 240 represented by the end point 244 may move faster (e.g., ahead of) or slower (e.g., lagging behind) the user's hand. This way, despite obstruction by a user's hand, the user may still notice changes in the illuminated portion 240 to know that control is being applied properly.

When the end point 244 of the illuminated portion 240 is configured to move faster than (e.g., ahead of) the rotating portion 222, the control circuit of the control device 200 may scale the full intensity range of the lighting load over less than a 360-degree rotation of the rotating portion 240 so that the illuminated portion 240 may expand or contract over the entire circumference of light bar 226 as the intensity of the lighting load is being adjusted between the low-end and high-end of an intensity range. For example, the control circuit may be configured to scale the full intensity range of the lighting load over a 210-degree rotation of the rotating portion 222, such that when a rotational movement of the rotating portion 222 reaches 210 degrees, the illuminated portion 240 may cover the entire circumference of the light bar (e.g., 360 degrees) to indicate that the intensity of the lighting load has reaches a maximum intensity. Such a technique may also reduce the amount of rotation required to, adjust, the intensity of the lighting load between the low-end and the high-end. For example, the user may be able to adjust the intensity over a greater range with less wrist movement.

The control device 200 (e.g., a control circuit included therein) may be configured to illuminate a portion of the light bar 226 and cause the length of the illuminated portion to expand and contract (e.g., simultaneously from both end points of the illuminated portion) to indicate the intensity of the lighting load. The illuminated portion may be illuminated uniformly to a common intensity. Alternatively, different sections of the illuminated portion may be illuminated to different intensities. For example, the end point 244 of the illuminated portion of the light bar 226 may be illuminated to a higher intensity than the rest of the illuminated portion and the intensity of the illuminated portion may be decreased towards the starting point 242. This way, a user may still receive feedback based on the length of the illuminated portion, but less battery power is consumed to provide the feedback.

Figure 13C:
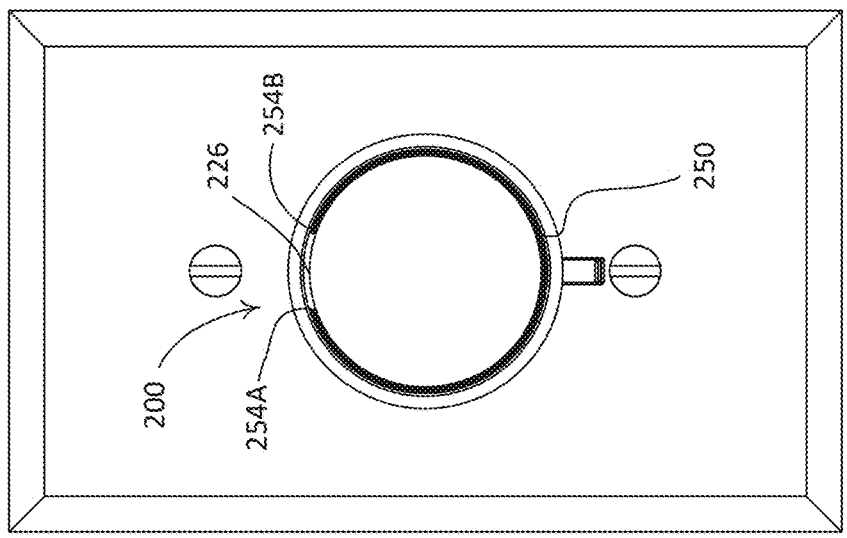
FIGS. 13A-13C show another set of front views of the example control device depicted in FIG. 2 when a light bar is illuminated to expand and contract from two end points to provide intensity indications on the light, bar.
Figure 13B:
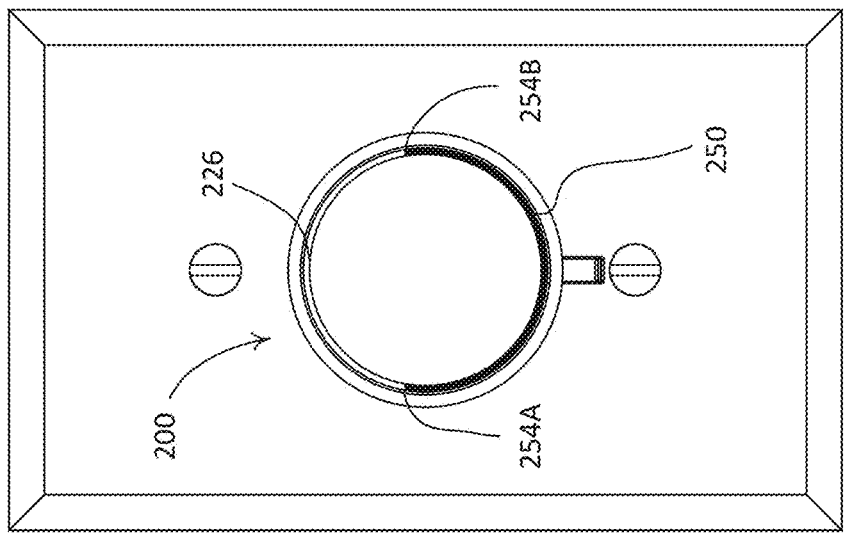
Figure 13A:
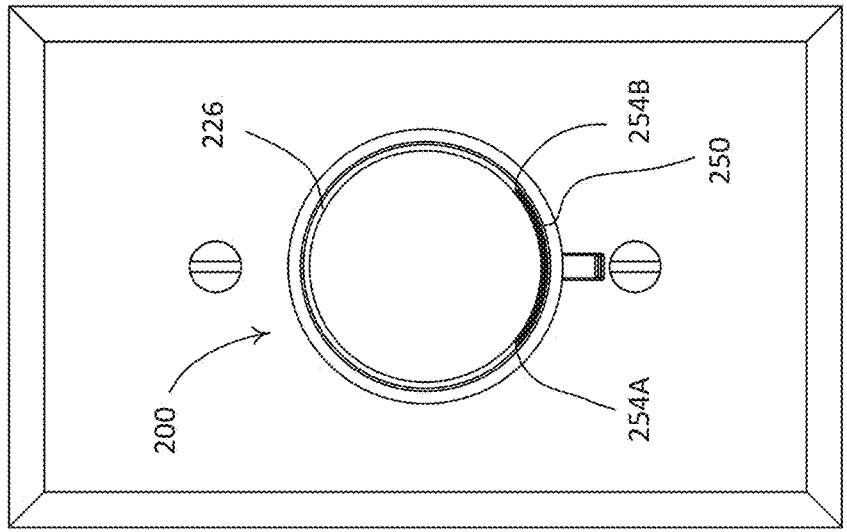

FIGS. 13A-13C show example front views of the control unit 220 when an illuminated portion 250 of the light bar 226 is controlled to expand and contract from both end points 254A, 254B of the illuminated portion 250 to indicate the intensity of a lighting load. As shown, when the control device 200 is manipulate to raise the intensity of the lighting load, the control circuit of the control device 200 may cause end points 254A, 254B of the illuminated portion 250 to move (e.g., simultaneously) in respective clockwise and counterclockwise directions such that the length of the illuminated portion 250 is extended to indicate that the light intensity is being raised. Similarly, when the control device 200 is manipulate to lower the intensity of the lighting load, the control circuit may cause end points 254A, 254B of the illuminated portion 250 to move (e.g., simultaneously) in respective counterclockwise and clockwise directions such that the length of the illuminated portion is shortened to indicate that the light intensity is being lowered. For example, the light bar 226 may be illuminated to indicate that the present intensity of the lighting load is approximately 20% as shown in FIG. 13A, approximately 60% as shown in FIG. 13B, and approximately 90% as shown in FIG. 13C. When the lighting load is at a full intensity (e.g., approximately full intensity), the end points 254A, 254B may meet at the top of the light bar 226, such that the light bar 226 is fully illuminated. The amount and/or speed of movement at end points 254A, 254B may be the same or may be different. The illuminated portion 250 may be centered around a vertical axis of the control device 200 when the control device is installed. As such, the illuminated portion 250 may provide multiple intensity indications (e.g., on both the left half and the right half of the light bar 226). Using such a mechanism, the likelihood of a user's hand obstructing the intensity indication may be reduced.

In the example shown in FIGS. 13A-13C, when the control device 200 is actuated (e.g., via the actuation portion 224) to turn the lighting load on, the light bar 226 may be illuminated to quickly increase the length of the illuminated portion 250 (e.g., from both end points 254A, 254B) to correspond to a last-known intensity of the lighting load before the lighting load was turned off. The control circuit of the control device 200 may be configured to store the last-known intensity of the lighting load in memory before the lighting load is turned off. When the control device 200 is actuated (e.g., via the actuation portion 224) to turn the lighting load off, the light bar 226 may be controlled to quickly decrease the length of the illuminated portion 250 (e.g., from both end points 254A, 254B toward the center of the illuminated portion 250) to indicate that the lighting load is being turned off. Prior to decreasing the length of the illuminated portion 250, the control device 200 may be configured to store the intensity of the lighting load in memory.

Figure 14C:
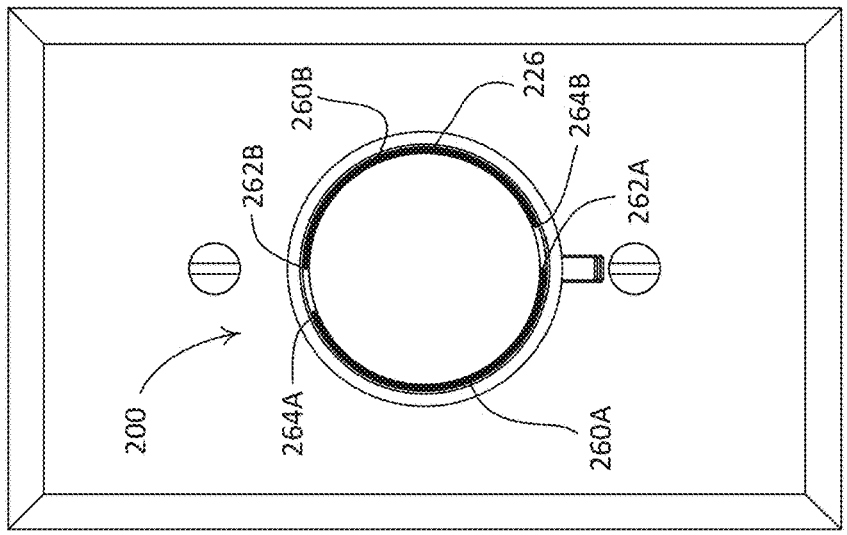
FIGS. 14A-14C show another set of front views of the example control device depicted in FIG. 2 when multiple portions of a light bar are illuminated to provide intensity indications on the light bar.
Figure 14B:
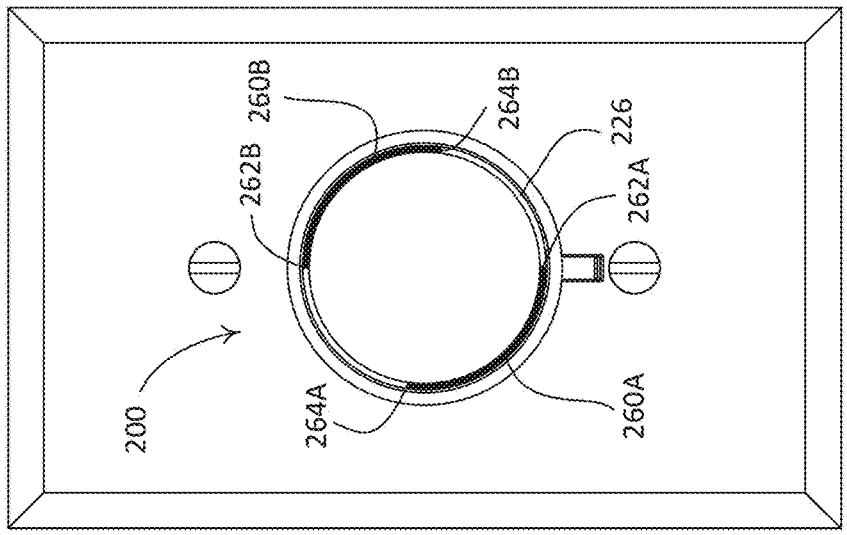
Figure 14A:
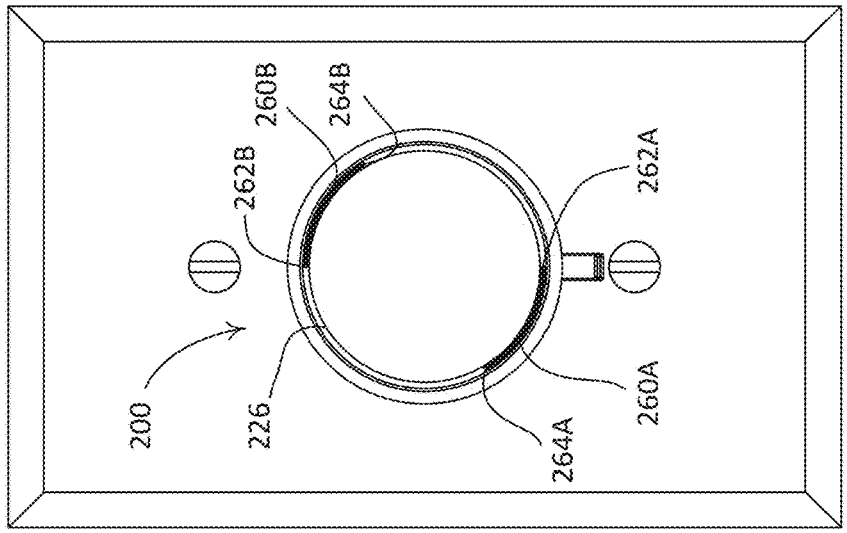

The control device 200 (e.g., a control circuit included therein) may be configured to illuminate multiple portions of the light bar 226 to provide multiple indications of the intensity of the lighting load. FIGS. 14A-14C show example front views of the control unit 220 when multiple portions of the light bar 226 are illuminated to show multiple intensity indications on the light bar 226. For example, the light bar 226 may be illuminated to generate a first illuminated portion 260A to indicate the intensity of the lighting load on a first portion of the light bar 226 (e.g., on the left half of the light bar 226) and a second illuminated portion 260B to indicate the intensity of the lighting load on a second portion of the light bar 226 (e.g., on right half of the light bar 226). The control circuit of the control device 200 may adjust the lengths, colors, and/or brightness levels of the illuminated portions 260A, 260B in response to changes in the intensity of the lighting load. The lengths, colors, and/or brightness levels of the illuminated portions 260A, 260B may indicate the intensity of the lighting load. The illuminated portions 260A, 260B may be illuminated uniformly to a common intensity. Alternatively, different sections of the illuminated portions 260A, 260B may be illuminated to different intensities. For example, the control circuit may illuminate end points 264A, 264B of the illuminated portions 260A, 260B to a higher intensity than the rest of the illuminated portions and may decrease the intensity of the illuminated portion towards the bottom of the light bar 226. This way, a user may still receive feedback based on the lengths of the illuminated portions 260A, 260B, but less battery power is consumed to provide the feedback.

As shown in FIGS. 14A-14C, the illuminated portions 260A, 260B may start from different starting points, e.g., 262A and 262B, respectively. The starting point 262A may be at the bottom of the light bar 226. The starting point 262B may be at the top of the light bar 226. The first illuminated portion 260A may end at the end point 264A on the left half of the light bar 226, and the second illuminated portion 260B may end at the end point 264B on the right half of the light bar 226. As such, the illuminated portions 260A, 260B may occupy positions of the light bar 226 that are diagonally across from each other (e.g. the illuminated portions may be centered along a diagonal axis of the control device 200 upon installation).

The first and, second illuminated portions 260A, 260B may have identical lengths that indicate the intensity of the lighting load. As the intensity of the lighting, load is increased, the end point 264A of the first illuminated portion 260A may move along the left half of the light bar 226 in the clockwise direction to extend the length of the first illuminated portion 260A, while the end point 264B of the second illuminated portion 260B may move along the right half of the light bar 226 in the clockwise direction to extend the length of the second illuminated portion 260B. As the intensity of the lighting load is decreased, the end point 264A of the first illuminated portion 260A may move along the left half of the light bar 226 in the counterclockwise direction to shorten the length of the first illuminated portion 260A, while the end point 264B of the second illuminated portion 260B may move along the right half of the light bar 226 in the counterclockwise direction to shorten the length of the second illuminated portion 260B. For example, the light bar 226 may be illuminated to indicate that the intensity of the lighting load is approximately 20% as shown in FIG. 14A, approximately 60% as shown in FIG. 14B, and approximately 90% as shown in FIG. 14C. When the lighting load is at a full intensity (e.g., approximately full intensity), end point 264A may meet starting point 262B at the top of the light bar 226, and end point 264B may meet starting point 262A at the bottom of the light bar 226, such that the light bar 226 is fully illuminated.

In the example shown in FIGS. 14A-14C, when the control device 200 is actuated (e.g., via the actuation portion 224) to turn the lighting load on, the light bar 226 may be illuminated to quickly increase the respective lengths of the illuminated portions 260A, 260B from starting points 262A, 262B to end points 264A, 264B such that the lengths of the illuminated portions 260A, 260B may correspond to a last-known intensity of the lighting load before the lighting load was turned off. The last-known intensity of the lighting load may be stored by the control device 200 in memory before the lighting load was turned off. When the control device 200 is actuated (e.g., via the actuation portion 224) to turn the lighting load off, the light bar 226 may be controlled to quickly decrease the respective lengths of the illuminated portions 260A, 260B (e.g., from end points 264A, 264B toward starting points 262A, 262B) to indicate that the lighting load is being turned off. Prior to decreasing the lengths of the illuminated portions 260A, 260B, the control device 200 may be configured to store the intensity of the lighting load in memory.

If the control device 200 is configured to control multiple lighting loads and set different intensities for the multiple lighting loads, the light bar 226 may be illuminated to indicate an average intensity level of the lighting loads. Alternatively, the light bar 226 may be illuminated to indicate the highest or lowest intensity among the multiple lighting loads, to indicate a default intensity, e.g., approximately 50%, to indicate the intensity of a lighting load nearest to the control device 200, etc.

Figure 15C:
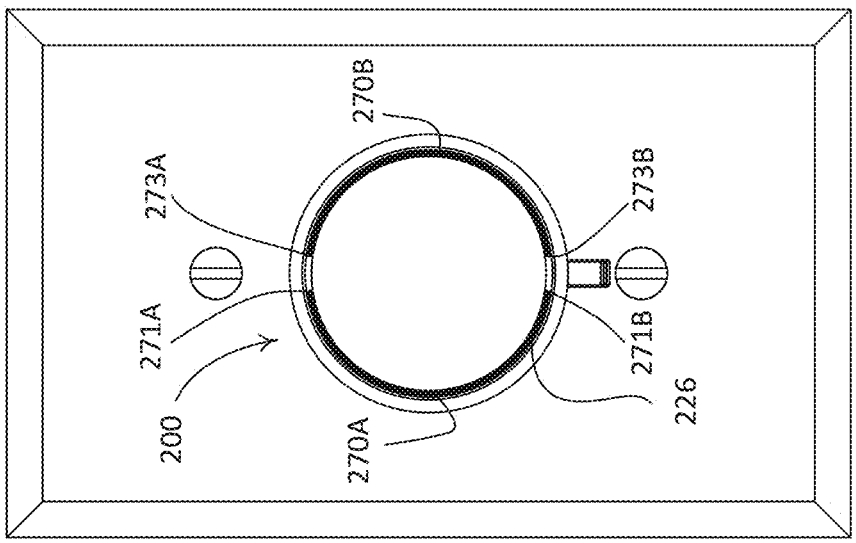
FIGS. 15A-15C show another set of front views of the example control device depicted in FIG. 2 when multiple portions of a light bar are illuminated to provide intensity indications on the light bar.
Figure 15B:
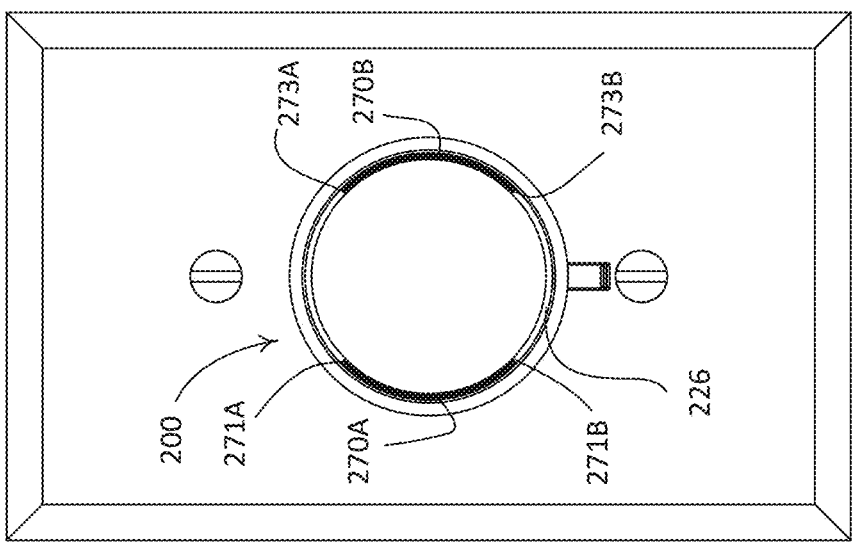
Figure 15A:
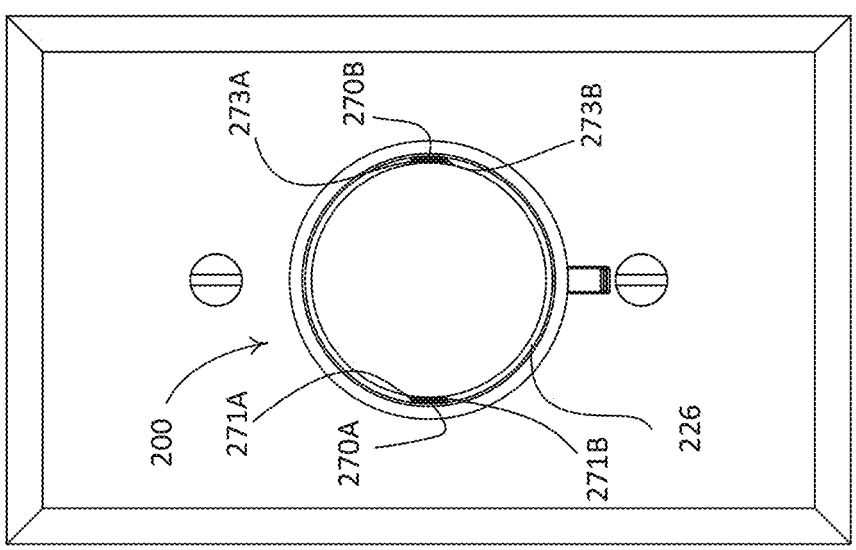

FIGS. 15A-15C show another set of example front views of the control unit 220 when more than one portion of the light bar 226 is illuminated to provide multiple intensity indications. As shown, two portions 270A, 270B of the light bar 226 may be illuminated. The illuminated portions 270A, 270B may occupy locations of the light bar 226 that are horizontally across from each other (e.g., illuminated portions 270A, 270B may be centered along a horizontal axis of the control device). The control circuit of the control device 200 may adjust the lengths, colors, and/or brightness levels of the illuminated portions 270A, 270B in response to changes in the intensity of the lighting load. The lengths, colors, and/or brightness levels of the illuminated portions 270A, 270B may indicate the intensity of the lighting load. The illuminated portions 270A, 270B may be illuminated uniformly to a common intensity. Alternatively, different sections of the illuminated portions 270A, 270B may be illuminated to different intensities. For example, the control circuit may illuminate end points 271A, 271B, 273A, 273B of the illuminated portions 270A, 270B to a higher intensity than the rest of the illuminated portions and may decrease the intensity of the illuminated portion 270A, 270B towards the left and right sides of the light bar 226. This way, a user may still receive feedback based on the lengths of the illuminated portions 270A, 270B, but less battery power is consumed to provide the feedback.

As shown in FIGS. 15A-15C, in response to the intensity of the lighting load being raised (e.g., via a rotational movement of the rotating portion 222 in a clockwise direction), the control circuit of the control device 200 may cause each of the illuminated portions 270A, 270B to expand (e.g., simultaneously at both end points) along the circumference of the light bar 226 so that the lengths of the illuminated portions 270A, 270B are extended to indicate that the intensity of the lighting load is being raised. When the intensity of the lighting load is lowered (e.g., via a rotational movement of the rotating portion 222 in a counterclockwise direction), the control circuit may cause each of the illuminated portions 270A, 270B to contract (e.g., simultaneously at both end points) so that the lengths of the illuminated portions 270A, 270B are shortened to indicate that the intensity of the lighting load is being lowered. For example, the light bar 226 may be illuminated in the aforementioned manner to indicate that the intensity of the lighting load is approximately 10% as shown in FIG. 15A, approximately 60% as shown in FIG. 15B, and approximately 90% as shown in FIG. 15C. When the lighting load is at a full intensity (e.g., approximately full intensity), the entire light bar 226 may be illuminated.

In the example shown in FIGS. 15A-15C, when the control device 200 is actuated (e.g., via the actuation portion 224) to turn the lighting load on, the light bar 226 may be illuminated to quickly increase the respective lengths of the illuminated portions 270A, 270B such that the lengths of the illuminated portions 270A, 270B may correspond to a last-known intensity of the lighting load before the lighting load was turned off. The last-known intensity of the lighting load may be stored by the control device 200 in memory before the lighting load was turned off. When the control device 200 is actuated (e.g., via the actuation portion 224) to turn the lighting load off, the light bar 226 may be controlled to quickly decrease the respective lengths of the illuminated portions 270A, 270B (e.g., from respective end points of each illuminated portion toward the center of the illuminated portion) to indicate that the lighting load is being turned off. Prior to decreasing the lengths of the illuminated portions 270A, 270B, the control device 200 may be configured to store the intensity of the lighting load in memory.

In one or more of the examples shown in FIGS. 13A-15C, the control circuit of the control device 200 may be configured to adjust the intensity of the light sources illuminating the end points of the illuminated portions (e.g., the illuminated portions 250, 260A, 260B, 270A, 270B) to provide fine-tune adjustment of the positions of the end points. For example, the control circuit may adjust the intensity of the light sources that illuminate the endpoints (e.g., end points 254A, 254B, 264A, 264B, 271A, 271B, 273A, 273B) between 1% and 100% to provide fine-tune adjustment of positions the end points. To illustrate, the control circuit may illuminate portions of the light bar 226 to specific lengths to indicate that the intensity of the lighting load is at approximately 30%. At that point, the intensity of the light sources illuminating the end points may be set at 1%. As the intensity of the lighting load is further adjusted toward 40%, the control circuit may adjust the intensity of the end points between 1% and 100% with finer granularity to correspond to respective intermediate intensity levels between 30% and 40%. After the intensity of the lighting load reaches 40%, the control circuit may illuminate additional light sources (e.g., to 1% intensity) to cause the lengths of the illuminated portions to expand. The control circuit, may then, adjust the intensity of the light sources that are now illuminating the end points between 1% and 100% as the intensity of the lighting load is being fine-tuned toward a next level (e.g., 50%).

Figure 16C:
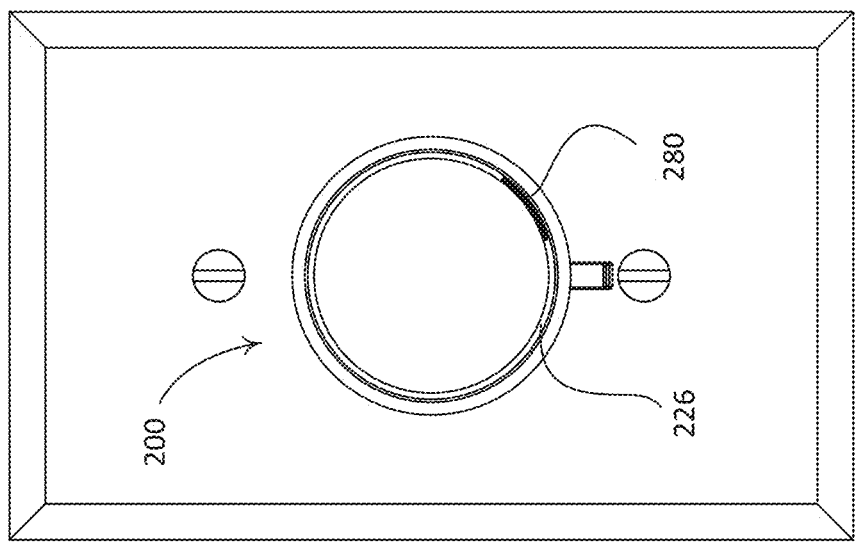
FIGS. 16A-16C show another set of example front views of the control unit 220 when a moving indication is provided on the light bar 226 to inform a user about a present intensity of a lighting load.
Figure 16B:
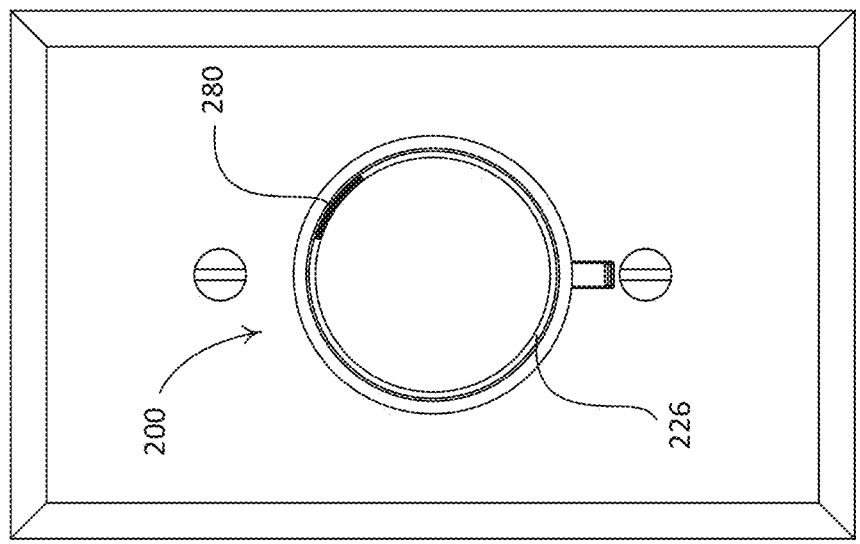
Figure 16A:
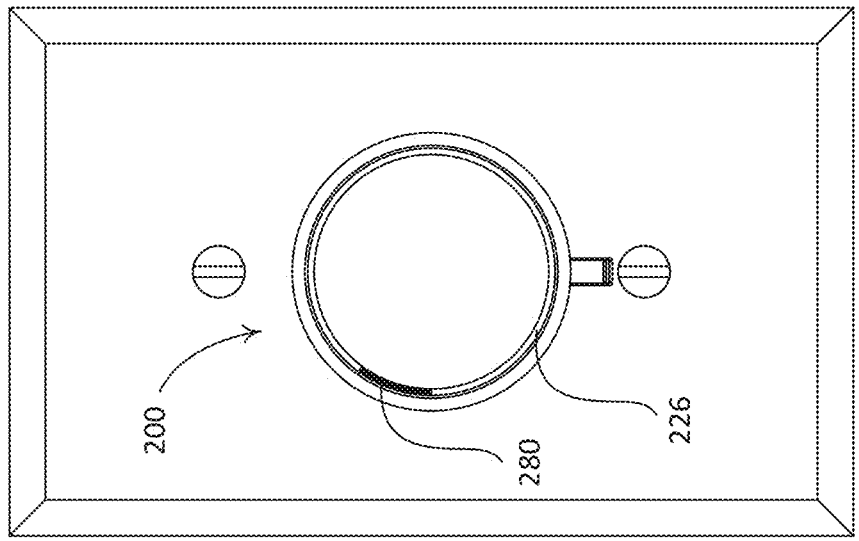

FIGS. 16A-16C show another set of example front views of the control unit 220 when a moving indication is provided on the light bar 226 to inform a user about the present, intensity of the lighting load. The moving indication 280 may be provided, for example, by alternately illuminating different subsets of the included light sources (e.g., different individual LEDs) in response to adjustments of the light intensity. Illuminating subsets of the light sources as opposed to illuminating an increasingly large number of light sources may reduce the amount of power (e.g., battery power) required for provided the intensity feedback. To illustrate, when the intensity of the lighting load is at the low-end, the control circuit may illuminate a light source (e.g., a single LED) located at the bottom of light bar 226 to provide the indication 280 near the bottom of the light bar 226. As the light intensity is increased, the control circuit may illuminate different individual light sources (e.g., different individual LEDs) located along the circumference of the light bar 226 in succession so that the indication 280 may move along the light bar 226 in a clockwise direction, as shown in FIGS. 16A-16C. The position of the indication 280 may correspond to the present intensity of the lighting load and as such may serve as an indication of the present intensity. For instance, the indication shown in FIG. 16A may indicate that the intensity of the lighting load is approximately 30%, and the indications shown in FIGS. 16B and 16C may indicate that the light intensity is approximately 60% and 90%, respectively. Similarly, when the light intensity is decreased, the control circuit may alternately illuminate the different individual light sources (e.g., the different individual LEDs) in an opposite direction (e.g., a counter-clockwise direction) to indicate that the light intensity is being lowered.

The indication 280 described above may be controlled to move continuously around the circumference of the light bar 226 or skip around the circumference in discrete steps to provide feedback about an amount of power delivered to an electrical load. For example, the control device 200 may be configured to control an electrical load the power of which can only be controlled to discrete levels. One such electrical load may be a ceiling fan with four speeds (e.g., a full speed and three intermediate speeds). As a result, the control circuit of the control device 200 may control the amount of power delivered to the fan to four discrete levels (e.g., 25%, 50%, 75%, and 100%) corresponding to the four speeds. In such scenarios, the control circuit of the control device 200 may provide feedback about the amount of power delivered to the fan (e.g., regarding the speed of the fan) by illuminating discrete segments of the light bar 226. For instance, in response to setting the power delivered to the fan to 25%, the control circuit may illuminate a first set of light sources (e.g., a first LED) located near the 90-degree position of the light bar 226. In response to setting the power delivered to the fan to 50%, the control circuit may illuminate a second set of light sources (e.g., a second LED) located near the top (e.g., the 180-degree position) of the light bar 226. Similarly, feedback for 75% power and 100% power may be provided at the 270-degree and 360-degree positions of the light bar 226, respectively.

Figure 17:
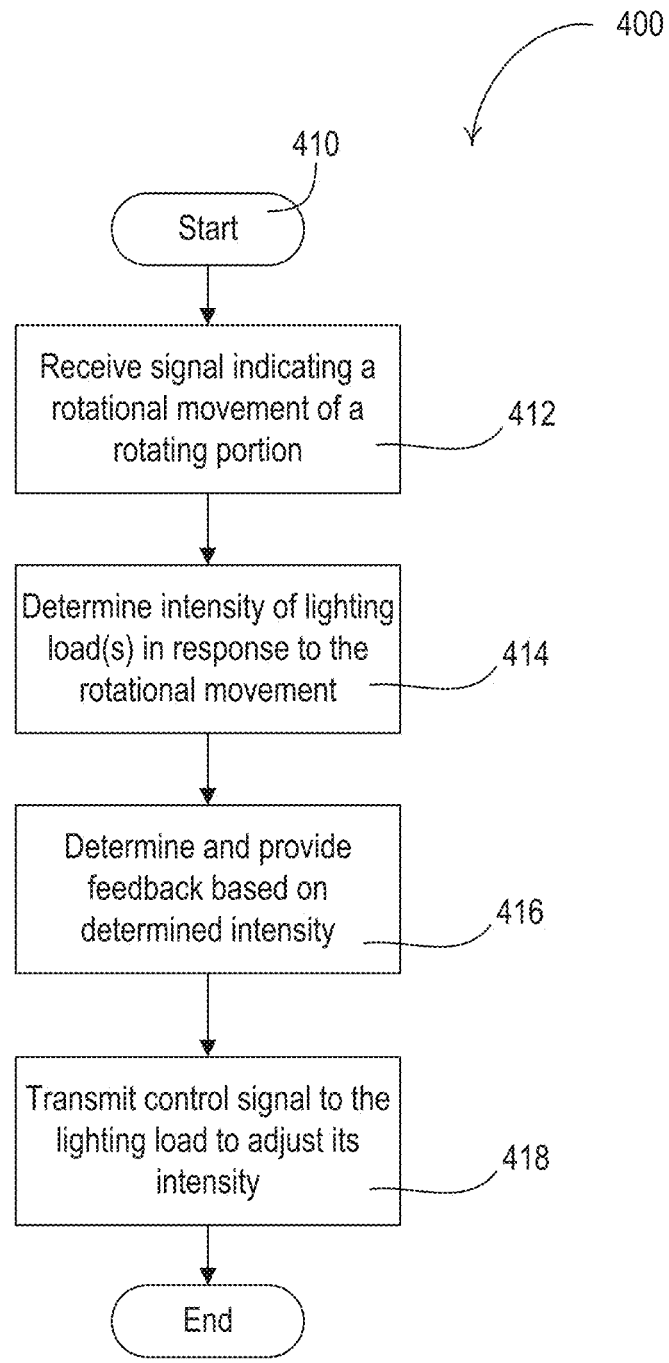
FIG. 17 shows a flow diagram of an example control procedure illustrating how the control device depicted in FIG. 2 may be configured to control and indicate the intensity of one or more lighting loads.

FIG. 17 shows a flow diagram of an example control procedure 400 illustrating how the control device 200 may be configured to control and indicate the intensity of one or more lighting loads. The control circuit of the control device 200 may perform the control procedure 400 periodically, for example, each time the control circuit receives a signal indicative of a user input. The control circuit may start at 410, and receive a signal at 412 indicating that a rotational movement of the rotating portion 222 has been applied by a user. In response to the signal, the control circuit may, at 414, determine a corresponding intensity for the one or more lighting loads. The determination may be made, for example, by querying the one or more lighting loads (e.g., requesting a current intensity level from the lighting loads) or using a last-known intensity stored by the control device 200. Further, the control, circuit may determine, at 416, feedback to be provided to the user. For example, when the determined intensity falls between a high-end intensity and a low-end intensity, the control circuit may illuminate the light bar 226 as described herein to, indicate the determined intensity. The control circuit may then transmit, at 418, a control signal to the lighting load(s) (e.g., via a wireless communication circuit, either directly or indirectly via a system controller) to cause the lighting load(s) to adjust their intensities accordingly. When the determined intensity is at the high-end or the low-end, the control circuit may act differently and/or provide additional feedback to the user. For example, the control circuit may be configured to provide additional feedback to alert the user that the intensity of the lighting load(s) has reached a maximum or minimum value. The feedback may include, for example, a haptic feedback, a visual feedback (e.g., strobing the light bar 226), an audible feedback (e.g., playing a special sound), and/or the like. Further, the control circuit may be configured to not transmit a control signal to the lighting load(s) since the intensity is already at the boundary of the intensity range.

The control device 200 (e.g., the control circuit included therein) may be configured to dim (e.g., turn off) the light bar 226 when the control device 200 is in an idle state (e.g., to conserve battery). The control device 200 may be configured to enter such an idle state, for example, upon detecting that a user of the control device is no longer within close proximity of the control device 200 or that no actuation of the control device has been applied for a certain time period. Subsequently, when the control device 200 detects an actuation of the control device 200 and/or determines that a user has entered the vicinity of the control device 200, the control device 200 may illuminate the light bar 226 to indicate the intensity of one or more lighting loads controlled by the control device 200.

The control device 200 may include a capacitive touch element or an electric field sensor (e.g., installed in or behind a front surface of the control device) that is capable of detecting a user's presence near the control device. For example, the control device may dim the light bar 226 (e.g., turn off the light bar 226) when the control device 200 is in the idle state. As a user walks close to the control device 200 and/or reaches for the control device 200 (e.g., before the user actually makes physical contact with the control device 200), the capacitive touch element or the electric field sensor may sense the proximity of the user, and signal that to the control circuit. The exact distance (e.g., between the user's finger or hand and the control device 200) that may trigger the signaling may vary, for example, depending on the property of the capacitive touch element or the electric field sensor employed. In response to receiving the signaling, the control circuit may illuminate the light bar 226 to provide an indication of the present intensity of the lighting load. If the lighting load is in an off state when the user reaches for the control, device 200, the control device 200 may not illuminate the light bar 226 or the control device 200 may illuminate the light bar 226 to reflect a last-known intensity of the lighting load before the lighting load was turned off. The control device may illuminate (e.g., to a low intensity) the light bar 226 and/or one or more other light sources (e.g., which may be configured to provide backlighting to a front surface of the control device 200) so that the control device 200 may become visible to the user.

The orientation of the control device 200 may be considered when implementing the features described herein. For example, the control device 200 may be configured to determine its orientation (e.g., via a sensor or through programming during association), and control how feedback is provided based on the determined orientation. In an example, the control device 220 may use the orientation of the control device to determine which portion of the light bar 226 should be illuminated so that intensity feedback may be displayed consistently. Examples of a control device capable of determining its orientations are described in greater detail in commonly assigned U.S. patent application Ser. No. 15/469,427, filed Mar. 24, 2017, entitled "Remote Load Control Device Capable of Orientation Detection," the entire disclosure of which is hereby incorporated by reference.

A user of the control device 200 may customize the manner in which intensity feedback is provided. For example, the user may select, during a configuration process of the control device 200, which of the feedback mechanisms shown in FIGS. 7-15C is to be used for intensity indication. Further, although the light bar 226 is shown and described in the examples as having a substantially circular shape and extending along the circumference of the rotating portion 222, it will be appreciated that the light bar 226 may have a different shape, location, and/or other geometric properties without affecting the features described herein. Moreover, the light bar 226 is described herein only as an example of how feedback may be provided to a user of the control device 200. Other feedback mechanisms are also within the scope of this disclosure. For example, instead of the light bar 226, a single light source (e.g., a single LED) may be illuminated in different manners (e.g., in terms of intensity and/or color) to indicate that the intensity of a lighting load is being raised or lowered.

The control device 200 may be powered by a battery (e.g., such as the battery 230). The battery may be stored in a battery compartment (e.g., the battery recess 362). Access to the battery compartment may be provided via a battery removal device such as the control unit release tab 216. As described above, a user may actuate the control unit release tab 216 (e.g., by pushing up toward the base portion 210 or pulling down away from the base portion 210) to remove the control unit 220 from the base portion 210. The user may then loosen the battery retention strap 232 to remove and replace the battery (e.g., as shown in FIG. 4).

The control device 200 may be configured to detect a low battery condition (e.g., via a battery power sensing circuit) and provide an indication of the low battery condition such that a user of the control device 200 may be alerted to replace the battery. Examples of battery power sensing circuits are described in greater detail in commonly assigned U.S. Pat. No. 8,950,461, issued Feb. 10, 2015, entitled "Motorized Window Treatment," the entire disclosure of which is hereby incorporated by reference.

The control device 200 may include a low battery indicator that may be illuminated by one or more light sources (e.g., red or other colored LEDs) to direct a user's attention to a low battery condition and/or the location of a battery removal device (e.g., the control unit release tab 216). The low battery indicator may be provided on or near the battery removal device to highlight the battery removal device. HG. 18A show an example front view of the control device 200 with a low battery indicator provided on or near the control unit release tab 216. The control unit release tab 216 may include a translucent (e.g., transparent, clear, and/or diffusive) material and may be illuminated by one or more light sources (e.g., LEDs) located above and/or to the side of the control unit release tab 216 (e.g., inside the control unit 220). The translucent material may permit the passage of light from the one or more light sources when illuminated, and remain minimally visible when not illuminated. The illumination may be steady or flashing (e.g., in a blinking manner) such that the low battery condition may catch a user's attention. The illumination may also direct the user to the control unit release tab 216, which may be used to access the battery compartment to replace the battery.

Figure 18B:
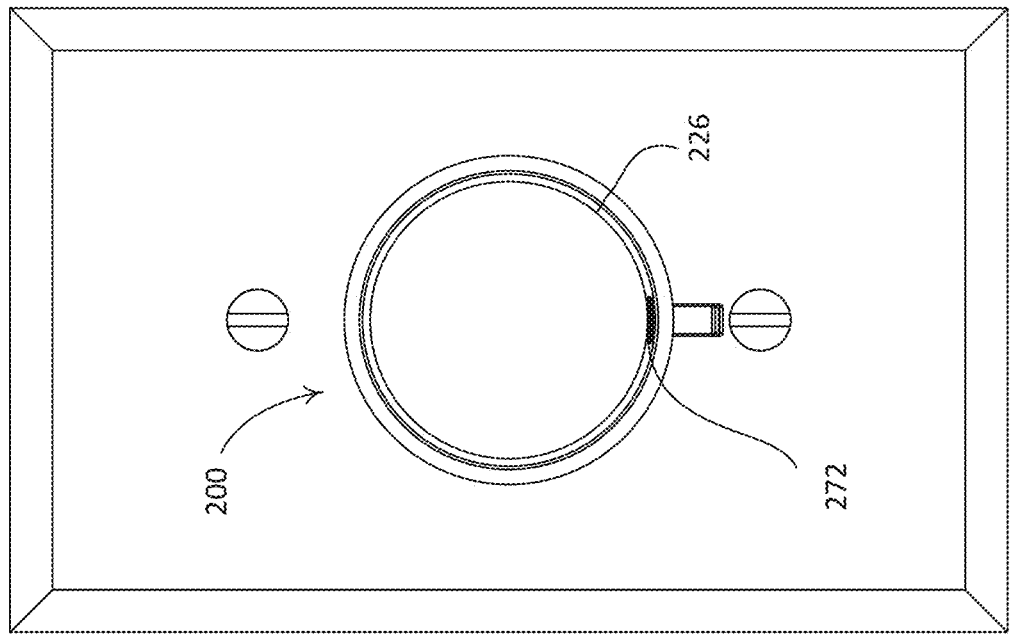
FIG. 18B shows an example front view of the control device depicted in FIG. 2 with a first way to provide a low battery indicator on a light bar.

The low battery indicator may also be provided via the light bar 226, for example, by illuminating one or more portions of the light bar 226. FIG. 18B shows an example front view of the control device 200 with a low battery indicator provided on the light bar 226. As shown, a bottom portion 272 of the light bar 226 may be illuminated when a low battery condition is detected. The length of the illuminated portion 272 may indicate the amount of battery power remaining (e.g., 10%). To distinguish from the illumination used as intensity feedback, and/or to attract a user's attention, the bottom portion 272 may be illuminated with a different color (e.g., via a red LED) and/or a special pattern (e.g., flashing). The control circuit of the control device 200 may be configured to stop displaying intensity feedback on the light bar 226 and to instead provide the low battery indicator on the light bar 226 after determining that a low battery condition has occurred.

Figure 19C:
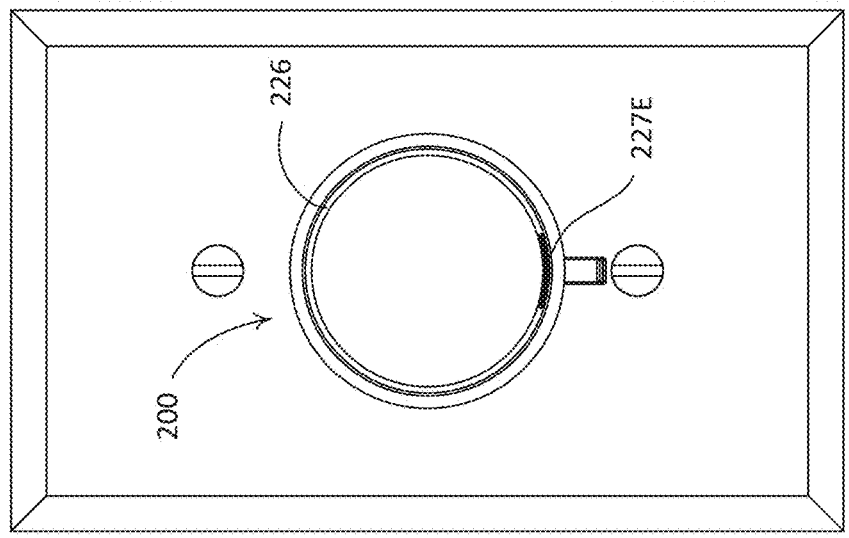
FIGS. 19A-19C show a set of example views of the control device depicted in FIG. 2 with a second way to provide a low battery indicator on a light bar.
Figure 19B:
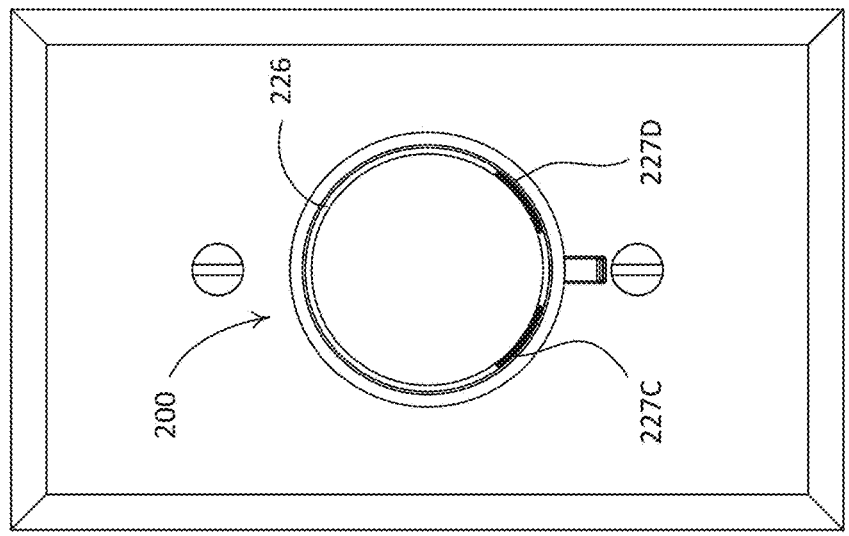
Figure 19A:
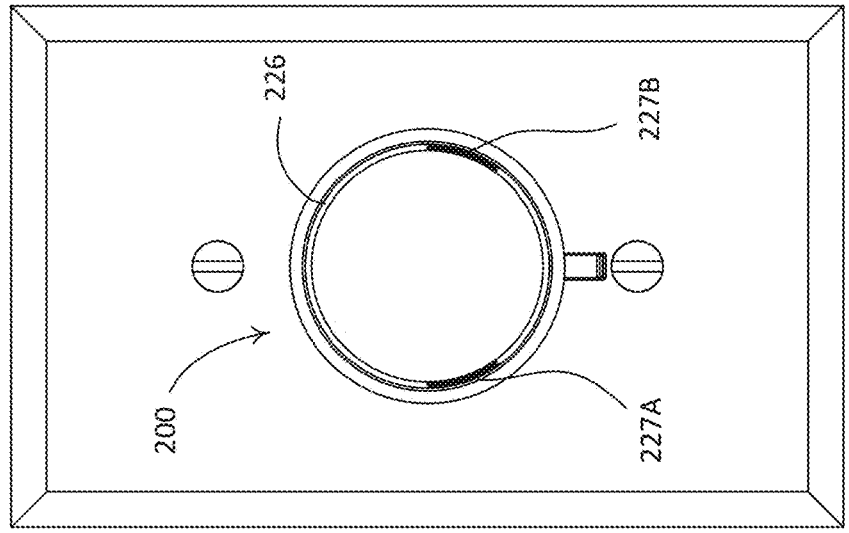

FIGS. 19A-19C show example views of the control device 200 illustrating another way to provide the low battery indicator on the light bar 226. As shown, the control circuit of the control device 200 may be configured to, upon detecting a low battery condition, illuminate multiple portions of the light bar 226 in alternation (e.g., to imitate an animation) to alert a user about the low battery condition and/or to direct the user's attention to the battery removal device (e.g., the control unit release tab 216). For example, after detecting the low battery condition, the control circuit may illuminate a first set of two portions 227A, 227B of the light bar 226 for a brief period. The control circuit may then dim (e.g., turn off) the portions 227A, 227B, and illuminate a second set of two portions 227C, 227D of the light bar 226 that are located below the portions 227A, 227B. After illuminating the portions 227C, 227D for a brief period, the control circuit may dim (e.g., turn off) those portions, and illuminate a bottom portion 227E of the light bar 226 above the control unit release tab 216 to inform the user of the location of the control unit release tab 216. The control circuit may be configured to repeat the foregoing pattern/animation periodically until the low battery condition is mitigated.

Although the battery removal device and the low battery indicator are described in the examples herein as being located at the bottom of the control device 200, it should be appreciated that, the battery removal device (e.g., the battery release tab 216) and/or the low battery indicator may occupy other locations of the control device including, for example, anywhere around the perimeter of the base portion of the control device 200 (e.g., the top or a side of the base portion). Consequently, the illumination pattern shown in FIGS. 19A-19C may be adjusted, for example to point upward or sideways so, that a user may follow the pattern to locate the battery removal device.

The low battery indicator may also be provided on a front surface of the control device 200 such as a front surface of the actuation portion 224. For example, in response to detecting a low battery condition, the control circuit of the control device 200 may cause an area of the front surface of the actuation portion 224 to be backlit (e.g., by one or more LEDs) to display indicia (e.g., texts or graphics) that alert a user about the low battery condition. The control circuit may cause the indicia to become dim (e.g., turned off) when the low battery condition is resolved.

The orientation of the control device 200 may be considered for low battery indication. For example, when providing low battery indication on the light bar 226, the control device 220 may determine its orientation (e.g., via a sensor or through programming during association), and adjust the illumination pattern/animation illustrated in FIGS. 19A-19C in accordance with the determination to ensure that the pattern/animation points in the direction of the battery removal device (e.g., downward, upward, sideways, etc.).

Figure 20:
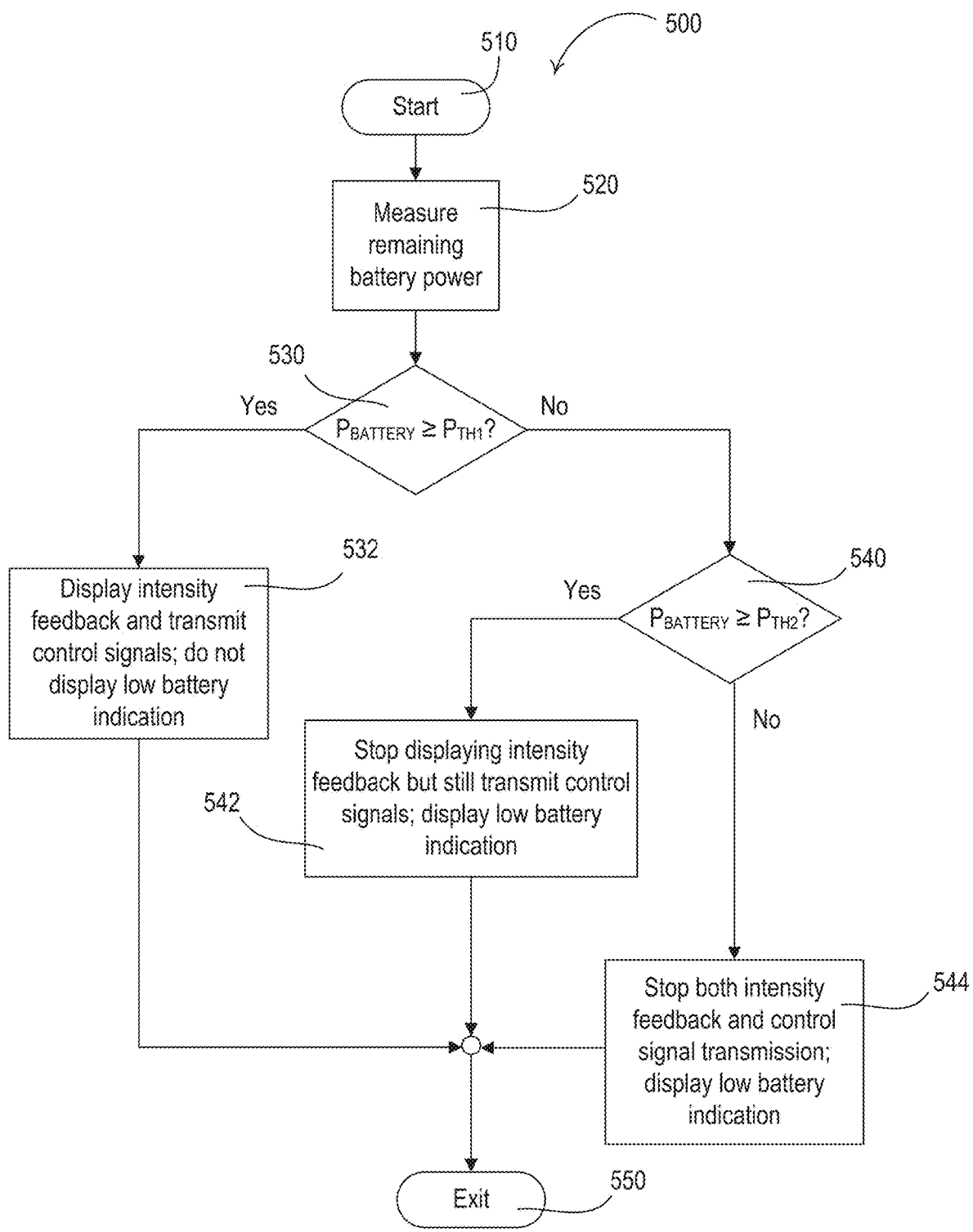
FIG. 20 shows a flow diagram of an example operating procedure illustrating how the control device depicted in FIG. 2 may be configured to operate differently in accordance with different battery power levels.

The control device 200 may adjust its operation based on the amount of battery power remaining. FIG. 20 is a flow diagram of an example operating procedure 500 that illustrates how the control device 200 may operate differently in accordance with different battery power levels. The control circuit of the control device 200 may be configured to perform the operating procedure 500 periodically, for example, every time the control circuit of the control device 200 wakes up from an idle state. As shown, the control device 200 (e.g., a control circuit of the control device) may start at 510, and measure the amount of remaining battery power at 520 via a battery power sensing circuit. The control circuit may determine, at 530, whether the remaining battery power is equal to or above a first power threshold $P_{TH1}$ (e.g., 20% of full capacity). If the answer is yes (e.g., there is more than 20% of battery power left), the control circuit may, at 532, display intensity feedback on the light bar 226 in response to a user's manipulation of the control device 200, as described herein. The control circuit may further transmit control signal(s) (e.g., via a wireless communication circuit) to effectuate the intensity adjustment, desired by the user. The control circuit may be regarded as operating, in a normal mode when the remaining battery power is equal to or above the first power threshold $P_{TH1}$ (e.g., 20% of full capacity). The control circuit may be configured to not provide a low battery indication while the control circuit is operating in the normal mode.

If the control circuit determines, at 530, that the remaining battery power is less than $P_{TH1}$ (e.g., there is less than 20% of power left), the control circuit may further determine, at 540, whether the remaining battery power is equal to or above a second power threshold $P_{TH2}$ (e.g., 5% of full capacity). If the answer at 540 is yes (e.g., there is less than 20% but more than 5% of power left), the control circuit may, at 542, stop displaying intensity feedback on the light bar 226 in response to a user's manipulation of the control device 200 (e.g., in order to conserve battery power). The control circuit may continue to transmit control signal(s) at this stage via the wireless communication circuit. As such, the control functions of the control device 200 may remain operational. The control circuit may be regarded as operating in a low battery mode when the remaining battery power is below the first power threshold $P_{TH1}$ (e.g., 20% of full capacity). The control circuit may be configured to provide a low battery indication while operating in the low battery mode, as described herein.

If the control circuit determines, at 540, that the remaining battery power is less than $P_{TH2}$ (e.g., there is less than 5% of power left), the control circuit may, at 544, stop both intensity feedback and the transmission of control signal(s) in response to a user's manipulation of the control device 200, before exiting at 550. At this stage, the control circuit is substantially shut down (e.g., except to display the low battery indication).

Figure 18A:
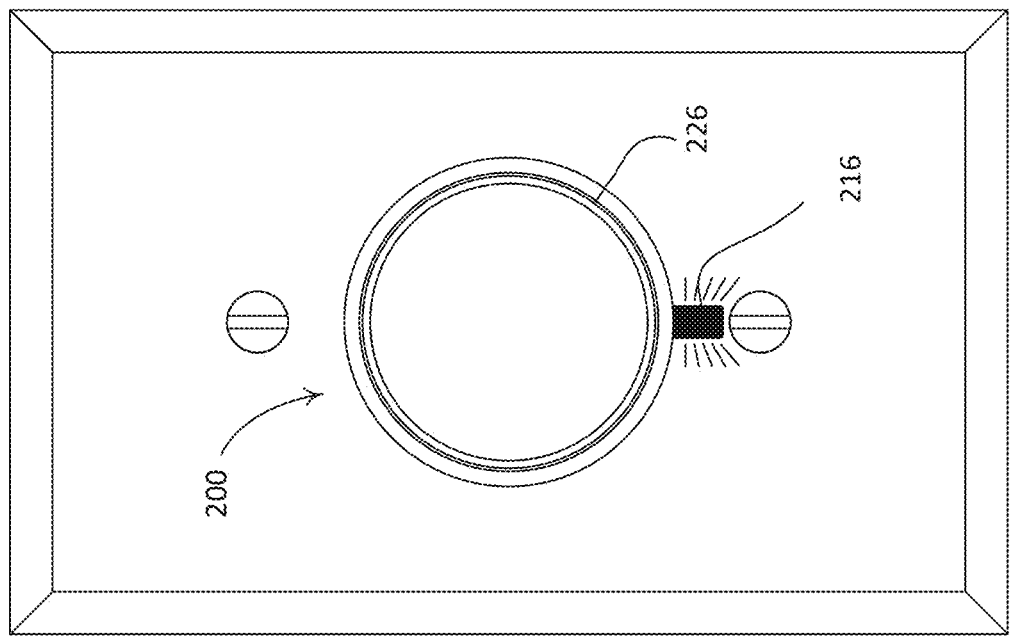
FIG. 18A shows an example front view of the control device depicted in FIG. 2 with a low battery indicator provided on or near a control unit release tab.

The control circuit of the control device 200 may be configured to use different mechanisms to provide the low battery indications in accordance with different levels of remaining battery power. For example, the control device 200 may be configured to provide low battery indications using the light bar 226 (e.g., as described with reference to FIGS. 18B and 19A-19C) if the remaining battery power is between $P_{TH1}$ and $P_{TH2}$. After the remaining battery power falls below $P_{TH2}$, the control device 200 may provide the low battery indications on the control unit release tab 216, as shown in FIG. 18A.

The control device 200 may be configured to dim (e.g., turn off) the low battery indicator when the control device 200 is in an idle state (e.g., to conserve battery). As described above, the control device 200 may enter such an idle state upon detecting that a user of the control device is no longer within close proximity of the control device 200 or that no actuation of the control device has been applied for a certain time period. Subsequently, when the control device 200 detects an actuation of the control device 200 and/or determines that a user has entered close proximity of the control device 200, the control device 200 may check the remaining battery power and illuminate the battery indicator in response to detecting a low battery condition (e.g., less than 20% battery power remaining). As described herein, the control device 200 may include a capacitive touch element or an electric field sensor (e.g., installed in or behind a front surface of the control device) that is capable of detecting a user's presence near the remote control device. The exact distance (e.g., between the user's hand and the control device 200) that may trigger the detection may vary, for example, depending on the property of the capacitive touch element or the electric field sensor employed. In an alternative implementation, the control device 200 may wake up periodically (e.g., even when no user is detected near the control device 200) to check the remaining battery power and illuminate the battery indicator in response to detecting a low battery condition.

While the control device 200 has been described with reference to the retrofit remote control device 112 having the rotating portion 222, the actuation portion 224, and the light bar 226, other control devices, such as a wall-mounted dimmer switch, may also be configured with similar rotating portions, actuation portions, and light bars as described herein.

The rotating portion 222, the actuation portion 224, and the light bar 226 of the control device 200 shown and described herein have circular shapes. However, the rotating portion 222, the actuation portion 224, and the light bar 226 of the control module 200 could have other shapes. For example, the rotating portion 222 and the actuation portion 224 may each have a rectangular shape, a square shape, a diamond shape, a triangular shape, an oval shape, a star shape, or any suitable shape. The front surface of the actuations portions 224 and/or the side surfaces of the rotating portion 222 may be planar or non-planar. In addition, the light bar 226 may have an alternative shape, such as a rectangular shape, a square shape, a diamond shape, a triangular shape, an oval shape, a star shape, or any suitable shape. The light bar 226 may each be a complete loop, a partial loop, a broken loop, a single linear bar, a linear or circular array of visual indicators, and/or other suitable arrangement. The surfaces of the control device 200 may be characterized by various colors, finishes, designs, patterns, etc.

Figure 21:
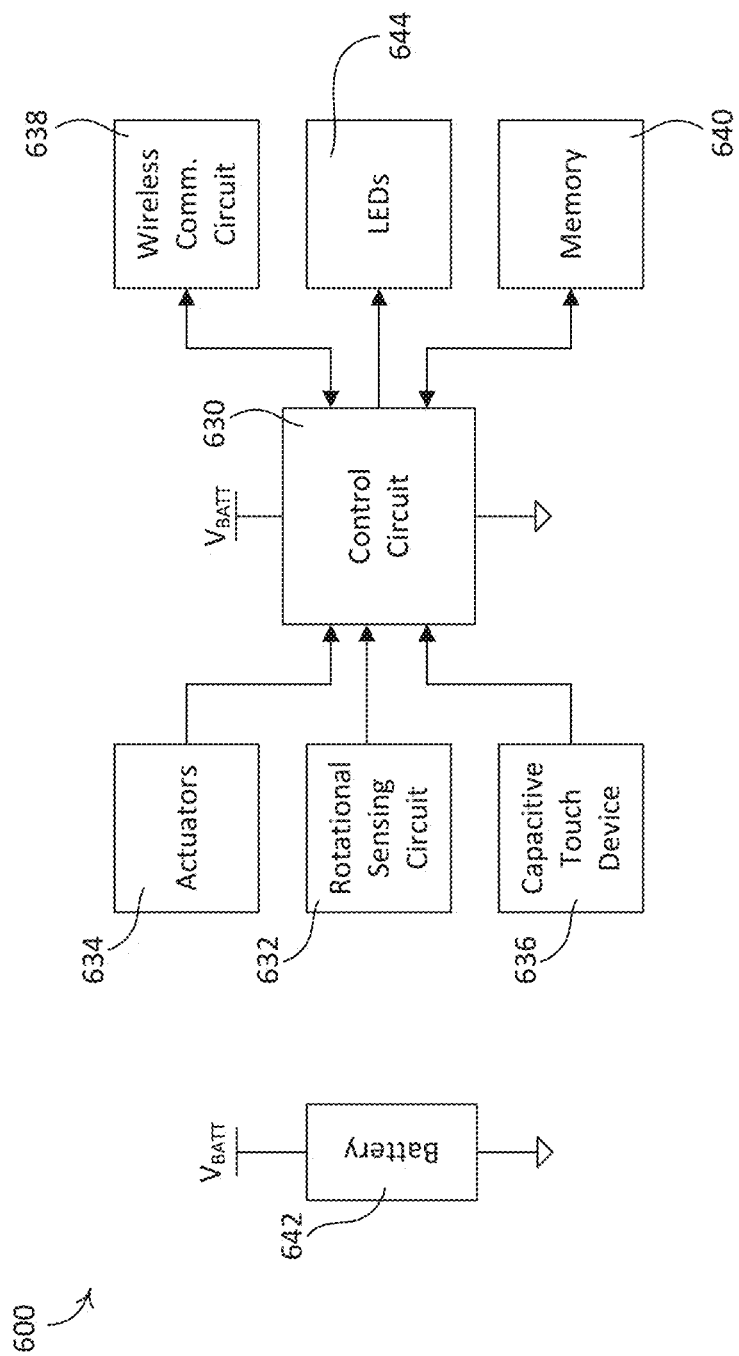
FIG. 21 shows a simplified equivalent schematic diagram for an example remote control device that may be deployed as one of the control devices depicted in FIG. 1.

FIG. 21 is a simplified equivalent schematic diagram of an example control device 600 (e.g., a remote control device), which may be deployed as control devices 112, 114, 116, or 118 of the load control system 100, for example. The control device 600 may include a control circuit 630, a rotational sensing circuit 632, one or more actuators 634 (e.g., buttons and/or switches), a capacitive touch or electric field sensing device 636, a wireless communication circuit 638, a memory 640, a battery 642, and/or one or more LEDs 644. The memory 640 may be configured to store one or more operating parameters (e.g., such as battery power thresholds $P_{TH1}$ and $P_{TH2}$) of the control device 600. The battery 642 may provide power to one or more of the components shown in FIG. 21.

The rotational sensing circuit 632 may be configured to translate a force applied to a rotating mechanism (e.g., such as the rotating portion 222 of the control device 200) into an input signal and provide the input signal to the control circuit 630. The rotational sensing circuit 632 may include, for example, one or more magnetic sensors (e.g., such as Hall-effect sensors (HES), tunneling magnetoresistance (TMR) sensors, anisotropic magnetoresistance (AMR) sensors, giant magnetoresistance (GMR) sensors, reed switches, or other mechanical magnetic sensors), a mechanical encoder, an optical encoder, and/or a potentiometer (e.g., a polymer thick film or other resistive trace on a printed circuit board). The rotational sensing circuit 632 may also operate as an antenna of the control device 600. The one or more actuators 634 may include a button or switch such as the actuation portion 224 of the control device 200. The actuators 634 may be configured to send input signal(s) to the control circuit 630 in response to actuations of the actuators 634 (e.g., in response to movements of the actuator 634). The capacitive touch or electric field sensing device 636 may be configured to detect a user's presence within close proximity of the control device 600, and signal the detection to the control circuit 630.

It should be noted that, although depicted as including all of the rotational sensing circuit 632, the actuators 634, and the capacitive touch or electric field sensing device 636, the control device 600 may include any combination of the foregoing components (e.g., one or more of those components).

The control circuit 630 may be configured to translate the input signals provided by the rotational sensing circuit 632, the actuators 634, and/or the capacitive touch or electric field sensing device 636 into control data (e.g., digital control signals) for controlling one or more electrical loads. The control circuit 630 may cause parts or all of the control data (e.g., digital control signals) to be transmitted to the electrical loads via the wireless communication circuit 638. For example, the wireless communication circuit 638 may transmit a control signal including the control data to the one or more electrical loads or to a central controller of the concerned load control system. The control circuit 630 may illuminated the LEDs 644 to present a light, bar (e.g., such as the light bar 226) and/or one or more indicators (e.g., such as the low battery indicator described herein) to provide feedback about various states or conditions of the control device 600 and/or the electrical loads.

Figure 22:
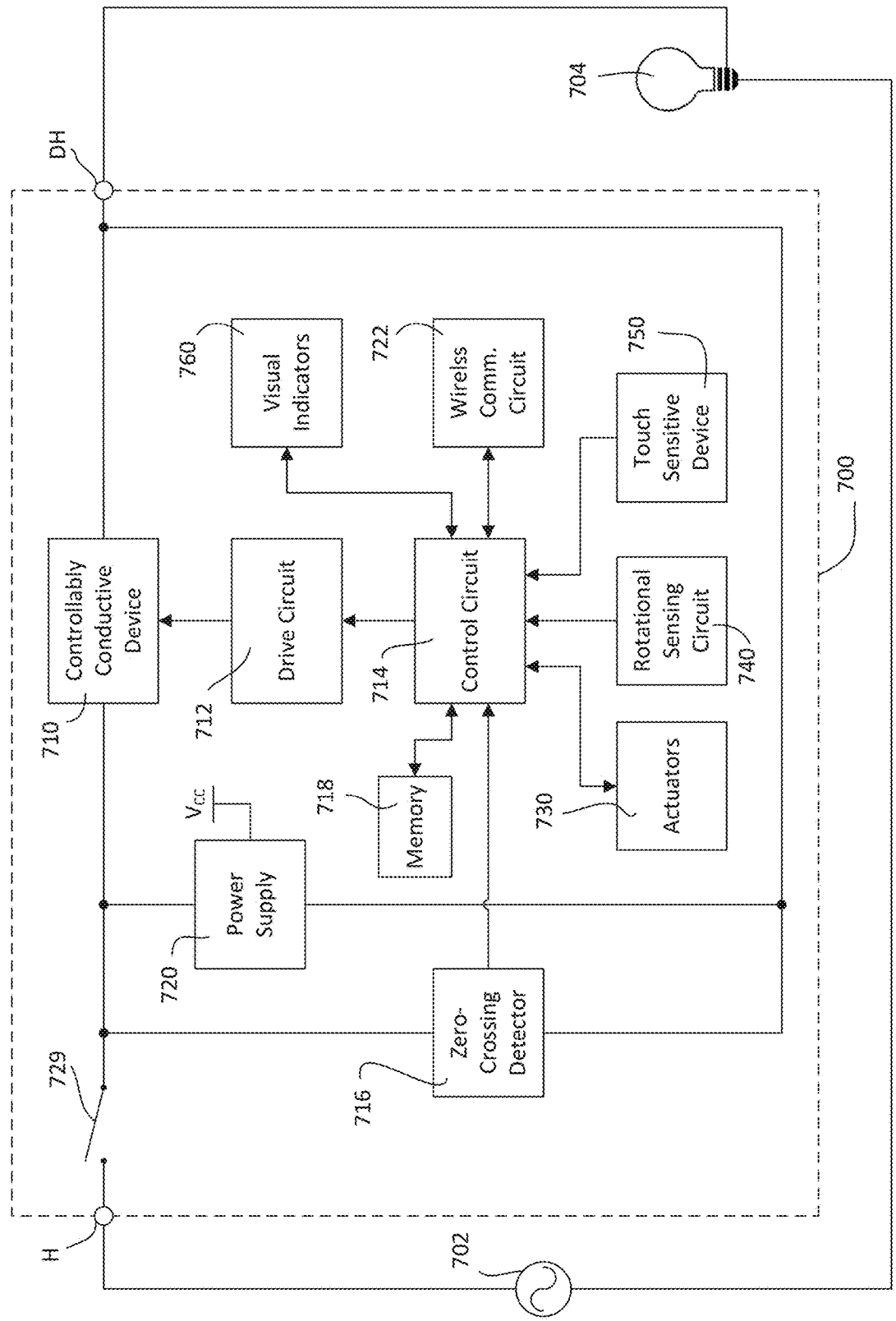
FIG. 22 shows a simplified equivalent schematic diagram for an example dimmer switch that may be deployed as one of the control devices depicted in FIG. 1.

FIG. 22 is a simplified block diagram of an example control device 700 (e.g., a dimmer switch) that may be deployed as the dimmer switch 110 of the load control system 100. The control device 700 may include a hot terminal H that may be adapted to be coupled to an AC power source 702. The control device 700 may include a dimmed hot terminal DH that may be adapted to be coupled to an electrical load, such as a lighting load 704. The control device 700 may include a controllably conductive device 710 coupled in series electrical connection between the AC power source 702 and the lighting load 704. The controllably conductive device 710 may control the power delivered to the lighting load. The controllably conductive device 710 may include a suitable type of bidirectional semiconductor switch, such as, for example, a triac, a field-effect transistor (FET) in a rectifier bridge, two FETs in anti-series connection, or one or more insulated-gate bipolar junction transistors (IGBTs). An air-gap switch 729 may be coupled in series with the controllably conductive device 710. The air-gap switch 729 may be opened and closed in response to actuations of an air-gap actuator (not shown). When the air-gap switch 729 is closed, the controllably conductive device 710 is operable to conduct current to the load. When the air-gap switch 729 is open, the lighting load 704 is, disconnected from the AC power source 702.

The control device 700 may include a control circuit 714. The control circuit 714 may include one or more of a processor (e.g., a microprocessor), a microcontroller, a programmable logic device (PLD), a field programmable gate array (FPGA), an application specific integrated circuit (ASIC), or any suitable controller or processing device. The control circuit 714 may be operatively coupled to a control input of the controllably conductive device 710, for example, via a gate drive circuit 712. The control circuit 714 may be used for rendering the controllably conductive device 710 conductive or non-conductive, for example, to control the amount of power delivered to the lighting load 704.

The control circuit 714 may receive a control signal representative of the zero-crossing points of the AC main line voltage of the AC power source 702 from a zero-crossing detector 716. The control circuit 714 may be operable to render the controllably conductive device 710 conductive and/or non-conductive at predetermined times relative to the zero-crossing points of the AC waveform using a phase-control dimming technique. Examples of dimmers are described in greater detail in commonly-assigned U.S. Pat. No. 7,242,150, issued Jul. 10, 2007, entitled Dimmer Having a Power Supply Monitoring Circuit; U.S. Pat. No. 7,546,473, issued Jun. 9, 2009, entitled Dimmer having a microprocessor-controlled power supply; and U.S. Pat. No. 8,664,881, issued Mar. 4, 2014, entitled Two-wire dimmer switch for low-power loads, the entire disclosures of which are hereby incorporated by reference.

The control device 700 may include a memory 718. The memory 718 may be communicatively coupled to the control circuit 714 for the storage and/or retrieval of, for example, operational settings, such as, battery power thresholds $P_{TH1}$, $P_{TH2}$. The memory 718 may be implemented as an external integrated circuit (IC) or as an internal circuit of the control circuit 714. The control device 700 may include a power supply 720. The power supply 720 may generate a direct-current (DC) supply voltage $V_{CC}$ for powering the control circuit 714 and the other low-voltage circuitry of the control device 700. The power supply 720 may be coupled in parallel with the controllably conductive device 710. The power supply 720 may be operable to conduct a charging current through the lighting load 704 to generate the DC supply voltage $V_{CC}$.

The control circuit 714 may be responsive to inputs received from actuators 730 and/or a rotational position sensing circuit 740. The control circuit 714 may control the controllably conductive device 710 to adjust the intensity of the lighting load 704 in response to the input received via the actuators 730 and/or the rotational position sensing circuit 740.

The rotary position sensing circuit 740 may be configured to translate a force applied to a rotating mechanism (e.g., such as the rotating portion 222) into an input signal and provide the input signal to the control circuit 714. The rotational position sensing circuit 740 may include, for example, one or more magnetic sensors (e.g., such as Hall-effect sensors (HES), tunneling magnetoresistance (TMR) sensors, anisotropic magnetoresistance (AMR) sensors, giant magnetoresistance (GMR) sensors, reed switches, or other mechanical magnetic sensors), a mechanical encoder, an optical encoder, and/or a potentiometer (e.g., a polymer thick film or other resistive trace on a printed circuit board). The rotational position sensing circuit 740 may also operate as an antenna of the control device 700. The actuators 730 may include a button or switch such as the actuator 224. The actuators 730 may be configured to send input signal(s) to the control circuit 714 in response to actuations of the actuators 730 (e.g., in response to movements of the actuators 730). A capacitive touch or electrical field sensing device 750 may be configured to detect a user's presence within close proximity of the control device 700, and signal the detection to the control circuit 714. The control circuit 714 may be configured to translate the input signals received from the actuators 730, the rotational position sensing circuit 740, and/or the capacitive touch or electrical field sensing device 750 into control data (e.g., one or more control signals). Some or all of the control data may be transmitted to the lighting load 704 or a central controller of the load control system.

It should be noted that, although depicted as including all of the rotational sensing circuit 740, the actuators 730, and the touch sensitive device 750, the control device 700 may include any combination of the foregoing components (e.g., one or more of those components).

The control device 700 may comprise a wireless communication circuit 722. The wireless communication circuit 722 may include for example, a radio-frequency (RF) transceiver coupled to an antenna for transmitting and/or receiving RF signals. The wireless communication circuit 722 may also include an RF transmitter for transmitting RF signals, an RF receiver for receiving RF signals, or an infrared (IR) transmitter and/or receiver for transmitting and/or receiving IR signals. The wireless communication circuit 722 may be configured, to transmit a control signal that includes parts or all of the control data (e.g., a digital message) generated by the control circuit 714 to the lighting load 704. As described herein, the control data may be generated in response to a user input to adjust one or more operational aspects of the lighting load 704. The control data may include a command and/or identification information (e.g., such as a unique identifier) associated with the control device 700. In addition to or in lieu of transmitting the control signal to the lighting load 704, the wireless communication circuit 722 may be controlled to transmit the control, signal to a central controller of the lighting control system.

The control circuit 714 may be configured to illuminate visual indicators 760 (e.g., LEDs) to provide feedback about the lighting load 704 and/or the control device 700. The visual indicators 760 may be configured to form a light bar and/or other types of visual displays.

Although described with reference to a lighting load and an intensity of the lighting load, one or more embodiments disclosed herein may be used with other electrical loads (e.g., such as an audio system) and for controlling an amount of power delivered to those electrical loads (e.g., to thus control the volume of an audio system). A single control circuit or multiple control circuits may be adapted to realize the control functionalities described herein.

What is claimed is:

1. A battery-powered control device for controlling an electrical load in a load control system, the control device comprising:
   a base portion;
   a battery compartment configured to store a battery for powering the control device;
   a low battery indicator configured to be illuminated to indicate a low battery condition; and
   a control unit configured to be mounted over the base portion and control an amount of power delivered to the electrical load, the control unit operable to determine whether a user of the control device is within close proximity of the control device and detect the low battery condition, wherein the control unit is further configured to illuminate the low battery indicator in response to detecting both a user within close proximity of the control device and the low battery condition.

2. The control device of claim 1, further comprising a capacitive touch element configured to detect that a user of the control device is within close proximity of the control device.

3. The control device of claim 1, further comprising a control unit removal device configured to release the control unit from the base portion to provide access to the battery compartment.

4. The control device of claim 3, wherein the low battery indicator is further configured to indicate a location of the control unit removal device.

5. The control device of claim 4, further comprising a light bar configured to be illuminated by a plurality of light sources, wherein the control unit is configured to, after determining that a user of the control device is within close proximity of the control device and in response to detecting the low battery condition, illuminate the light bar to provide the low battery indicator on the light bar, the control unit further configured to, after determining that a user of the control device is within close proximity of the control device and that the low battery condition has not occurred, illuminate the light bar to indicate the amount of power delivered to the electrical load.

6. The control device of claim 5, wherein the control unit is configured to provide the low battery indicator on the light bar by illuminating the light bar to display an animation, the animation indicating the low battery condition and a location of the control unit removal device.

7. The control device of claim 1, further comprising a rotating portion for adjusting the amount of power delivered to the electrical load.

8. The control device of claim 7, further comprising a substantially circular light bar configured to be illuminated by a plurality of light sources.

9. The control device of claim 8, wherein the control unit is further configured to, after determining that a user of the control device is within close proximity of the control device and that the low battery condition has not occurred, illuminate the light bar to indicate the amount of power delivered to the electrical load.

10. The control device of claim 9, wherein the control unit is configured to, after determining that a user of the control device is within close proximity of the control device and in response to detecting the low battery condition, illuminate the light bar to provide the low battery indicator on the light bar.

11. The control device of claim 8, further comprising an actuation portion that is configured to move in toward the base portion in response to a user actuation of the actuation portion;
   wherein the control unit is configured to transmit a command to toggle the light source between off and on in response to an actuation of the actuation portion; and
   wherein the bar is configured to extend along a perimeter of the rotation portion or a perimeter of the actuation portion.

12. The control device of claim 11, wherein the light bar is configured to move with the actuation portion when the actuation portion is moved toward the base portion.

13. The control device of claim 11, wherein the base portion is configured to be mounted over an actuator of a mechanical switch that controls power delivered to the electrical load.

14. The control device of claim 1, wherein the base portion is configured to be mounted over an actuator of a mechanical switch that controls power delivered to the electrical load.

15. A battery-powered control device for controlling an electrical load in a load control system, the control device comprising:
    a base portion;
    a control unit configured to control an amount of power delivered to the electrical load;
    a plurality of light sources configured to be illuminated to indicate an amount of power delivered to the electrical load; and
    a battery compartment configured to store a battery for powering the control unit;
    wherein the control unit is further configured to detect a low battery condition, and, upon detecting the low battery condition, illuminate multiple subsets of the plurality of light sources in alternation to alert a user about a low battery condition.

16. The control device of claim 15, wherein the control unit comprises a rotating portion for adjusting the amount of power delivered to the electrical load; and
    wherein the control circuit is configured to generate control data for controlling the amount of power delivered to the electrical load in response to rotations of the rotating portion.

17. The control device of claim 16, wherein the plurality of light sources are implemented as a light bar, and the light bar extends along the perimeter of the rotation portion.

18. The control device of claim 17, further comprising:
    a battery compartment configured to store a battery for powering the control unit; and
    a low battery indicator configured to be illuminated to indicate a location of the control unit removal device.

19. The control device of claim 18, wherein the control circuit is further configured to, after detecting the low battery condition, illuminate a first set of two portions of the light bar for a period of time, illuminate a second set of two portions of the light bar that are located below the first set of two portions for a period of time, and illuminate a bottom portion of the light bar located above the control unit removal device to indicate the location of the control unit removal device.

20. The control device of claim 15, wherein the base portion is configured to be mounted over an actuator of a mechanical switch that controls power delivered to the electrical load.

* * * * *